United States Patent
Hirose et al.

(10) Patent No.: US 8,436,654 B2
(45) Date of Patent: May 7, 2013

(54) LEVEL CONVERTER CIRCUIT FOR USE IN CMOS CIRCUIT DEVICE PROVIDED FOR CONVERTING SIGNAL LEVEL OF DIGITAL SIGNAL TO HIGHER LEVEL

(75) Inventors: Tetsuya Hirose, Kobe (JP); Yuji Osaki, Kobe (JP); Toshihiko Mori, Yokohama (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 89 days.

(21) Appl. No.: 13/181,825

(22) Filed: Jul. 13, 2011

(65) Prior Publication Data

US 2012/0013362 A1 Jan. 19, 2012

(30) Foreign Application Priority Data

Jul. 14, 2010 (JP) ................................ 2010-159588

(51) Int. Cl.
*H03K 19/0175* (2006.01)
(52) U.S. Cl.
USPC .................................. 326/63; 326/68; 326/81
(58) Field of Classification Search .............. 326/62–63, 326/68, 80–83, 86–87; 327/333
See application file for complete search history.

(56) References Cited

U.S. PATENT DOCUMENTS

| | | | |
|---|---|---|---|
| 5,465,057 A | 11/1995 | Takahashi | |
| 6,922,319 B2 | 7/2005 | Akita | |
| 7,176,740 B2 * | 2/2007 | Tachibana et al. | 327/333 |
| 7,382,172 B2 * | 6/2008 | Lin et al. | 327/333 |
| 7,714,612 B1 * | 5/2010 | Pertijs | 326/62 |
| 7,714,613 B2 * | 5/2010 | Mori | 326/63 |
| 2009/0153190 A1 * | 6/2009 | Monk | 326/63 |
| 2009/0243654 A1 * | 10/2009 | Mori | 326/64 |
| 2012/0025870 A1 * | 2/2012 | Ng et al. | 326/63 |

FOREIGN PATENT DOCUMENTS

| | | |
|---|---|---|
| JP | 4-159814 | 6/1992 |
| JP | 6-311014 | 11/1994 |
| JP | 2002-311063 | 10/2002 |
| JP | 2006-135384 | 5/2006 |
| JP | 2007-180671 | 7/2007 |

OTHER PUBLICATIONS

Henzler, "Power Management of Digital Circuits in Deep Sub-Micron CMOs Technologies", Springer, pp. 34-38, Oct. 2006.

(Continued)

*Primary Examiner* — Jany Tran
(74) *Attorney, Agent, or Firm* — Wenderoth, Lind & Ponack, L.L.P.

(57) ABSTRACT

A level converter circuit is provided for converting an input signal of a digital signal having a first signal level into an output signal having a second signal level higher than the first signal level. An amplifier circuit amplifies the input signal and outputs an amplified output signal, and a current generator circuit generates a control current corresponding to an operating current flowing through the amplifier circuit upon change of the signal level of the input signal. A current detector circuit detects the generated control current, and controls the operating current of the amplifier circuit to correspond to the detected control current. The current generator circuit includes series-connected first and second nMOS transistors as inserted between the current detector circuit and the ground. The first nMOS transistor operates responsive to the input signal, and the second nMOS transistor operates responsive to an inverted signal of the input signal.

8 Claims, 17 Drawing Sheets

OTHER PUBLICATIONS

Kanno et al., "Level Converters with High Immunity to Power-Supply Bouncing for High Speed Sub-1-V LSIs", Digest of Technical Papers of 2000 Symposium on VLSI Circuits, pp. 202-203, Jun. 2000.

Chang et al., "Robust Level Converter Design for Sub-threshold Logic", in Proceedings of the International Symposium on low Power Electronics and Design (ISLPED), pp. 14-19, Oct. 2006.

Kwon et al., "Fast-Delay and Low-Power Level Shifter for Low-Voltage Applications", IEICE Transactions on Electronics, vol. E90-C, No. 7, pp. 1540-1543, Jul. 2007.

Shao et al., "Low Energy Level Converter Design for Sub-Vth Logics", in proceedings of Asia and South Pacific Design Automation Conference (ASP-DAC), pp. 107-108, Jan. 2009.

Lin et al., "Single Stage Static Level Shifter Design for Subthreshold to I/O Voltage Conversion", in proceeding of the 13$^{th}$ International Symposium on Low Power Electronics and Design (ISLPED), pp. 197-200, Aug. 2008.

Ishihara et al., "Level Conversion for Dual-Supply Systems", IEEE Transactions on Very Large Scale Integration (VLSI) Systems, vol. 12, Issue 2, pp. 185-195, Feb. 2004.

* cited by examiner

LEVEL CONVERTER CIRCUIT FOR USE IN CMOS CIRCUIT DEVICE PROVIDED FOR CONVERTING SIGNAL LEVEL OF DIGITAL SIGNAL TO HIGHER LEVEL

BACKGROUND OF THE INVENTION

1. Field of the Invention

The present invention relates to a level converter circuit for use in a CMOS circuit device, and in particular, to a level converter circuit that converts a signal level of a digital signal from a first voltage level to a second voltage level higher than the first voltage level.

2. Description of the Related Art

As the most effective technique for reducing the power consumption of LSIs, a reduction in the power supply voltage can be enumerated. In particular, a technique for supplying an optimal power supply voltage to each of circuit blocks is adopted for the recent LSIs, and therefore, it is sometimes the case where power supply voltages which are optimum for the circuit blocks differ from one another. Accordingly, a level converter circuit is needed between such circuits of different signal levels. Up to now, a variety of level converter circuits have been reported. The existing circuits generally have level converter circuits based on a latch structure. However, these level converter circuits have such a problem that the driving power of transistors driven by a low power supply voltage becomes extremely small when the difference voltages between the power supply voltages of the circuits are relatively large, and a stable level conversion operation is not guaranteed.

Prior art documents related to the present invention are as follows:

PATENT DOCUMENT

Patent Document 1: Japanese patent laid-open publication No. JP 6-311014 A;
Patent Document 2: Japanese patent laid-open publication No. JP 2006-135384 A; and
Patent Document 3: Japanese patent laid-open publication No. JP 2007-180671 A.

NON-PATENT DOCUMENTS

Non-Patent Document 1: S. Henzler, "Power Management of Digital Circuits in Deep Sub-Micron CMOS Technologies", Springer, October 2006;
Non-Patent Document 2: Y. Kanno et al., "Level converters with high immunity to power-supply bouncing for high-speed sub-1-V LSIs", Digest of Technical Papers of 2000 Symposium on VLSI Circuits, pp. 202-203, June 2000;
Non-Patent Document 3: I. J. Chang et al., "Robust level converter design for sub-threshold logic", in Proceedings of the International Symposium on Low Power Electronics and Design (ISLPED), pp. 14-19, October 2006;
Non-Patent Document 4: O-S. Kwon et al., "Fast-delay and low-power level shifter for low-voltage applications", IEICE Transactions on Electronics, Volume E90-C, number 7, pp. 1540-1543, July. 2007;
Non-Patent Document 5: H. Shao et al., "Low energy level converter design for sub-Vth logics", in Proceedings of Asia and South Pacific Design Automation Conference (ASP-DAC), pp. 107-108, January 2009;
Non-Patent Document 6: Y.-S. Lin et al., "Single stage static level shifter design for subthreshold to I/O Voltage conversion", in Proceeding of the 13th International Symposium on Low Power Electronics and Design (ISLPED), pp. 197-200, August 2008; and
Non-Patent Document 7: F. Ishihara et al., "Level conversion for dual-supply systems", IEEE Transactions on Very Large Scale Integration (VLSI) Systems, Volume 12, Issue 2, pp. 185-195, February 2004.

Up to now, the consumption power reductions of CMOS (Complementary Metal Oxide Semiconductor) semiconductor integrated circuits have been achieved by microfabrication of devices and by reduction of the power supply voltage accompanying to this. Since the power consumption of a digital circuit is expressed by the square of the power supply voltage, the reduction of the power supply voltage is an extremely effective technique for reduction of the consumption power. In the recent LSIs, a technique for supplying power supply voltages optimum for circuit blocks is adopted, and therefore, a design of varied power supply voltages for the circuit blocks is performed (See the Non-Patent Document 1). Therefore, a level converter circuit is needed between the circuits of different signal levels.

FIG. 1 is a block diagram showing an application example of a prior art level converter circuit 100. Referring to FIG. 1, the level converter circuit 100 converts the signal level of a signal from a low voltage circuit block 200 to which a low power supply voltage VDDL (e.g., 0.4 V) is supplied, and then, outputs the resulting signal to a high voltage circuit block 300 to which a high power supply voltage VDDH (e.g., 3 V) is supplied. An input signal IN inputted from the low voltage circuit block 200 to the level converter circuit 100 is a binary signal having a high level or a low level. The electrical potential of the high level is the low power supply voltage VDDL, and the electrical potential of the low level is the ground potential. Moreover, an output signal OUT outputted by the level converter circuit 100 to the high voltage circuit block 300 is a binary signal having the high level or the low level. The electrical potential of the high level is the high power supply voltage VDDH, and the electrical potential of the low level is the ground potential. Hereinafter, the voltage level of the low power supply voltage VDDL is referred to as a first high level, and the voltage level of the high power supply voltage VDDH is referred to as a second high level. Moreover, a voltage source having the low power supply voltage VDDL is referred to as a low voltage source, and a high voltage source having the high power supply voltage VDDH is referred to as a high voltage source.

Up to now, a variety of level converter circuits have been reported. A larger number of level converter circuits are each configured to include a latch circuit of cross-couple connected p-channel MOSFETs (Metal Oxide Semiconductor Field Effect Transistors) (hereinafter referred to as pMOS transistors) and n-channel MOSFETs (hereinafter referred to as nMOS transistors). However, the nMOS transistors of these level converter circuits are to be driven by a low power supply voltage, and therefore, a circuit design considering driving powers between the pMOS transistors and the nMOS transistors becomes extremely important. In a level converter circuit based on a latch circuit, a positive feedback circuit is configured to include cross-couple connecting pMOS transistors. Therefore, a variety of improving measures, such as a technique for improving the driving power of the nMOS transistors by designing the channel width of the nMOS transistors large to invert the output signal, and a technique for reducing the driving power of the cross-couple connected pMOS transistors have been tried (See the Non-Patent Document 2 to 7 and the Patent Documents 1 to 3). However, when the difference voltage between the power supply voltages are increased as a consequence of the voltage reductions of the power supply voltages, it becomes difficult to guarantee stable level conversion operation by these designing techniques.

First of all, the cross-couple connection type level converter circuit of the prior art level converter circuit will be described, and the problems thereof will be described.

FIG. 2 is a circuit diagram showing a configuration of a prior art cross-coupled level converter circuit 100. The level converter circuit 100 is configured to include nMOS transistors (MN101, MN102), to the gates of which a signal IN and an input signal INB are inputted, respectively, and cross-couple connected pMOS transistors (MP101, MP102). In this case, the input signal IN and the input signal INB have a complementary relation. When the input signal IN becomes the first high level, the voltages of the input signal INB and the node N101 become the low level. By this operation, the terminal T102 is charged via the pMOS transistor MP102, and the level converter circuit 100 outputs an output signal OUT of the second high level. On the other hand, when the input signal IN becomes the low level, the input signal INB becomes the first high level. The nMOS transistor MN102 discharges the terminal T102, and the level converter circuit 100 outputs an output signal OUT of the low level.

However, the prior art level converter circuit 100 has such a problem that the prior art level converter circuit 100 does not normally operate when there is a large difference between a current to charge the terminal T102 and a current to discharge the terminal. This becomes especially significant when the difference voltage between power supply voltages (between the high power supply voltage VDDH and the low power supply voltage VDDL) becomes large. For example, when the input signal IN becomes the low level from the first high level, the nMOS transistor MN102 is driven by the low power supply voltage VDDL of the low voltage source. In this case, when the current flowing through the pMOS transistor MP102 becomes larger than the current flowing through the nMOS transistor MN102, then the logic value (signal level) of the output signal OUT is not inverted, and the second high level is maintained. That is, the output signal OUT remains the second high level regardless of the fact that the input signal IN is the low level, and the level converter circuit 100 does not normally operate.

In order to guarantee a stable operation in the prior art level converter circuit 100, it is required to strike a balance between the amount of the current flowing through the nMOS transistor MN102 and the amount of the current flowing through the pMOS transistor MP102. For this purpose, it is required to appropriately set the channel width and the threshold voltage of the nMOS transistor MN102 and the pMOS transistor MP102. However, the amplitude of the voltage inputted to the gate of the pMOS transistor MP102 has a wide range from the ground voltage to the high power supply voltage VDDH, while the amplitude of the voltage inputted to the gate of the nMOS transistor MN102 has a narrow range from the ground voltage to the low power supply voltage VDDL. That is, when the voltage difference between the high power supply voltage VDDH and the low power supply voltage VDDL becomes relatively large, it becomes difficult for the prior art level converter circuit 100 to strike a balance between the amount of the current flowing through the nMOS transistor MN102 and the amount of the current flowing through the pMOS transistor MP102. Further, when the amounts of the currents flowing through the nMOS transistor MN102 and the pMOS transistor MP102 change due to process variations and temperature changes, the level converter circuit 100 does not stably operate.

The level converter circuits for ameliorating these problems are proposed (See the Non-Patent Documents 2 to 7 and the Patent Documents 1 to 3). However, many of these level converter circuits, which have circuit configurations based on the cross-couple connection to easily strike a balance between the currents flowing through the nMOS transistor and the pMOS transistor, can not solve the aforementioned problems.

SUMMARY OF THE INVENTION

An object of the present invention is to solve the aforementioned problems and provide a level converter circuit that is able to stably operate even when the difference voltage of the power supply voltages between circuit blocks is relatively large and to operate with low power consumption as compared with the prior art.

In order to achieve the aforementioned objective, according to one aspect of the present invention, a level converter circuit is provided for converting an input signal that is a digital signal having a first signal level into an output signal having a second signal level higher than the first signal level. The level converter circuit includes an amplifier, a current generator circuit, and a current detector circuit. The amplifier circuit that amplifies the input signal and outputs an amplified output signal, and the current generator circuit generates a control current corresponding to an operating current flowing through the amplifier circuit when the signal level of the input signal changes. The current detector circuit that detects the control current generated by the current generator circuit, and controls the operating current of the amplifier circuit to correspond to the detected control current. The current generator circuit includes first and second nMOS transistors that are inserted between the current detector circuit and the ground, and connected in series, and the first nMOS transistor operates in response to the input signal, and the second nMOS transistor operates in response to an inverted signal of the input signal.

The above-mentioned level converter circuit preferably further includes a control circuit that changes a substrate potential of the first and second nMOS transistors so as to increase the control current to be larger than that of a conventional level converter circuit by lowering threshold voltages of the first and second nMOS transistors to be smaller than that of the conventional level converter circuit.

In addition, the above-mentioned level converter circuit preferably further includes a further nMOS transistor that is connected in parallel to each of the first and second nMOS transistors so that the control current is increased so as to be larger than that of a conventional level converter circuit.

Further, in the above-mentioned level converter circuit, the current generator circuit further includes at least one of a rise current generator circuit and a fall current generator circuit. The rise current generator circuit generates the control current for correction so that the output signal becomes a high level when the signal level of the input signal does not change, the input signal has the high level, and the output signal has a low level. The fall current generator circuit generates the control current for correction so that the output signal becomes the low level when the signal level of the input signal does not change, the input signal has the low level, and the output signal has the high level.

Still further, in the above-mentioned level converter circuit, the rise current generator circuit further includes a pMOS transistor, and fourth and fifth nMOS transistors. The pMOS transistor and a third nMOS transistor are inserted between a voltage source and the ground and connected in series via a predetermined node, and the fourth and fifth nMOS transistors are inserted between the current detector circuit and the ground and connected in series. The pMOS transistor operates in response to the output signal, the third nMOS transistor operates in response to the input signal, the fourth nMOS transistor operates in response to the input signal, and the fifth nMOS transistor operates in response to a signal level at the node.

In addition, in the above-mentioned level converter circuit, the fall current generator circuit includes sixth and seventh nMOS transistors that are inserted between the current detector circuit and the ground and connected in series. The sixth nMOS transistor operates in response to the inverted signal of the input signal, and the seventh nMOS transistor operates in response to the output signal.

Further, in the above-mentioned level converter circuit, the amplifier circuit includes a differential amplifier circuit and a source-grounded amplifier circuit.

Still further, in the above-mentioned level converter circuit, the source-grounded amplifier circuit is a push-pull type source-grounded amplifier circuit.

According to the level converter circuit of the present invention, the signal level is converted by applying the current corresponding to the current generated by the current generator circuit to the amplifier circuit. Therefore, even when the difference between the first signal level and the second signal level is large, the level converter circuit stably operates. Moreover, the current generator circuit generates the control current only when the signal level of the input signal changes and does not generate the control current when the signal level of the input signal does not change, and therefore, the level converter circuit operates with low power consumption.

In addition, according to the level converter circuit of the present invention, the control circuit that changes the substrate potential of the first and second nMOS transistors are further provided so that the control current is increased as compared with the conventional level converter circuit by lowering the threshold voltages of the first and second nMOS transistors as compared with the conventional level converter circuit. Therefore, the level converter circuit operates at higher speed than the conventional level converter circuit.

Further, according to the level converter circuit of the present invention, the other nMOS transistors are connected in parallel with the first and second nMOS transistors, respectively, so that the control current is increased as compared with conventional the level converter circuit. Therefore, the level converter circuit operates at higher speed than the conventional level converter circuit.

Still further, according to the level converter circuit of the present invention, the rise current generator circuit or the fall current generator circuit generate the control current even when there is no period or time interval during which both the input signal and the inverted signal of the input signal have the high level, and therefore, the level converter circuit normally operates. Further, the rise current generator circuit or the fall current generator circuit generates the control current even when the signal level of the output signal changes due to disturbances such as external noises, and therefore, the level converter circuit normally operates.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5(a) shows the voltages of the input signal IN and the input signal INB, and FIG. 5(b) shows the current $I_{A1}$;

DETAILED DESCRIPTION OF THE PREFERRED EMBODIMENTS

Preferred embodiments according to the present invention will be described below with reference to the attached drawings.

First Preferred Embodiment

Figure 3A:
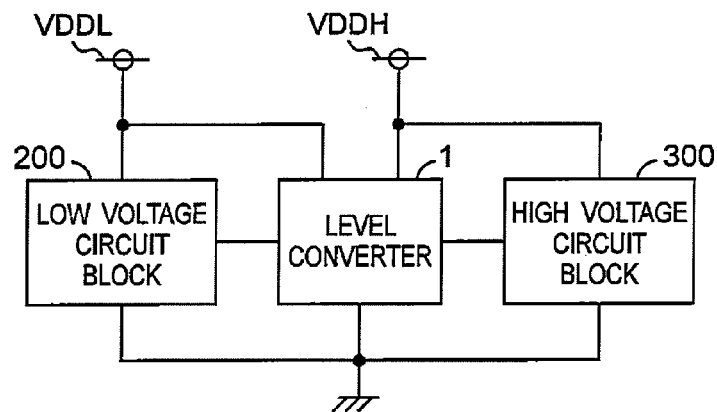
FIG. 3A is a block diagram showing an application example of a level converter circuit 1 according to a first preferred embodiment of the present invention.

FIG. 3A is a block diagram showing an application example of a level converter circuit 1 according to the first preferred embodiment of the present invention. Referring to FIG. 3A, the level converter circuit 1 converts the signal level of a signal from a low voltage circuit block 200 to which the low power supply voltage VDDL (e.g., 0.4 V) is supplied and outputs the resulting signal to a high voltage circuit block 300 to which the high power supply voltage VDDH (e.g., 3 V) is supplied. An input signal IN inputted from the low voltage circuit block 200 to the level converter circuit 1 is a binary signal having the high level or the low level. The electrical potential of the high level is the low power supply voltage VDDL, and the electrical potential of the low level is the ground potential. The output signal OUT outputted to the high voltage circuit block 300 by the level converter circuit 1 is a binary signal having the high level or the low level. The electrical potential of the high level is the high power supply voltage VDDH, and the electrical potential of the low level is the ground potential. The voltage level of the low power supply voltage VDDL is hereinafter referred to as a first high level, and the voltage level of the high power supply voltage VDDH is referred to as a second high level. Moreover, a voltage source having the low power supply voltage VDDL is referred to as a low voltage source, and a voltage source having the high power supply voltage VDDH is referred to as a high voltage source.

Figure 3B:
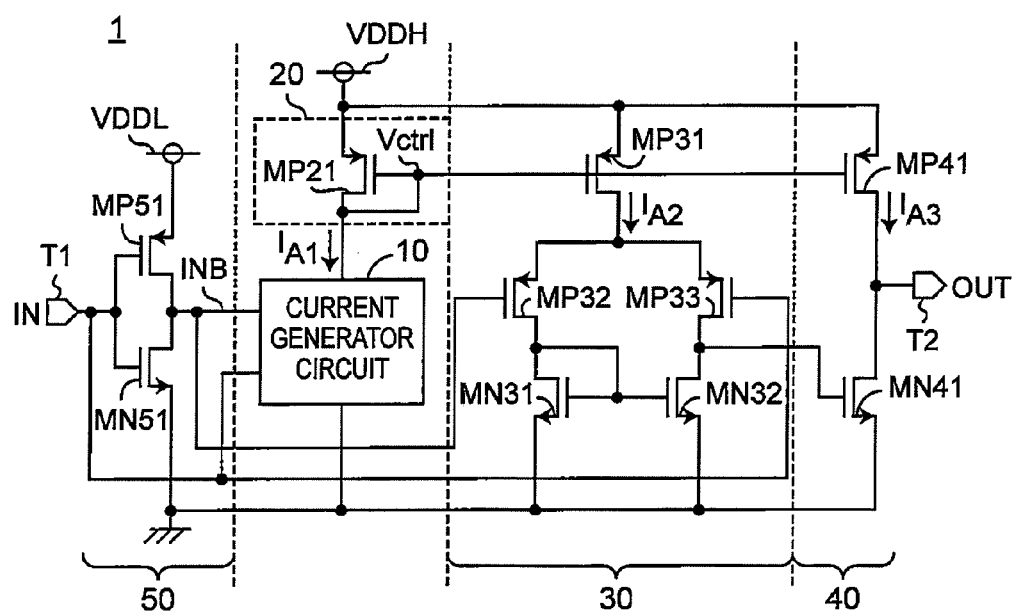
FIG. 3B is a block diagram showing a configuration of the level converter circuit 1 of the first preferred embodiment of the present invention.

FIG. 3B is a block diagram showing a configuration of the level converter circuit 1 of the first preferred embodiment of the present invention. Referring to FIG. 3B, the level converter circuit 1 is configured to include a current generator circuit 10, a current detector circuit 20, a differential amplifier circuit 30, a source-grounded amplifier circuit 40, a preprocessing circuit 50, and terminals T1 and T2.

The level converter circuit 1 of the first preferred embodiment converts the input signal IN of a digital signal having the first high level into the output signal OUT having the second high level higher than the first high level, and the level converter circuit 1 is characterized in that the level converter circuit 1 includes the following:

(a) the differential amplifier circuit 30 and the source-grounded amplifier circuit 40 for amplifying the input signal IN and outputting the output signal OUT;

(b) the current generator circuit 10 for generating a control current $I_{A1}$ corresponding to operating currents $I_{A2}$ and $I_{A3}$ flowing through the differential amplifier circuit 30 and the source-grounded amplifier circuit 40, respectively, when the voltage of the input signal IN changes; and (c) the current detector circuit 20 for detecting the control current $I_{A1}$ generated by the current generator circuit 10 and controlling each of the operating currents $I_{A2}$ and $I_{A3}$ of the differential amplifier circuit 30 and the source-grounded amplifier circuit 40 so as to corresponds to the control current $I_{A1}$, and (d) the current generator circuit 10 has nMOS transistors MN11 and MN12 that are inserted between the current detector circuit 20 and the ground and connected in series and, (e) the nMOS transistor MN 11 operates in response to the input signal IN, and the nMOS transistor MN12 operates in response to the inverted signal INB of the input signal IN.

The preprocessing circuit 50 is configured to include a pMOS transistor MP51 and an nMOS transistor MN51. The source of the pMOS transistor MP51 is connected to a low voltage source. The gate of the pMOS transistor MP51 and the gate of the nMOS transistor MN51 are connected to a terminal T1, and the input signal IN from the low voltage circuit block 200 is inputted to its gate. The drain of the pMOS transistor MP51 is connected to the drain of the nMOS transistor MN51. The source of the nMOS transistor MN51 is grounded. The pMOS transistor MP51 and the nMOS transistor MN51 are connected in series to constitute an inverter, and the inverter outputs a signal INB (hereinafter referred to as an input signal INB) obtained by inverting the input signal IN to the current generator circuit 10 and the differential amplifier circuit 30.

As described in detail later, the current generator circuit 10 is connected to the current detector circuit 20, the preprocessing circuit 50 and the terminal T1, and the grounding part of the circuit is grounded.

The current detector circuit 20 is configured to include a pMOS transistor MP21. The source of the pMOS transistor MP21 is connected to a high voltage source, and the gate of the pMOS transistor MP21 is connected to the gate of a pMOS transistor MP31 and the gate of a pMOS transistor MP41 and also connected to the drain of the pMOS transistor MP21. The drain of the pMOS transistor MP21 is connected to the current generator circuit 10. The pMOS transistors MP21, MP31 and MP41 constitute a current mirror circuit.

The differential amplifier circuit 30 is configured to include pMOS transistors MP31, MP32 and MP33, and nMOS transistors MN31 and MN32. The source of the pMOS transistor MP31 is connected to the high voltage source, and the drain of the pMOS transistor MP31 is connected to the source of the pMOS transistor MP32 and the source of the pMOS transistor MP33. The gate of the pMOS transistor MP32 is connected to the preprocessing circuit 50, and the input signal INB is inputted to its gate. The drain of the pMOS transistor MP32 is connected to the drain of the nMOS transistor MN31. The gate of the pMOS transistor MP33 is connected to the terminal T1, and the input signal IN is inputted to its gate. The drain of the pMOS transistor MP33 is connected to the drain of the nMOS transistor MN32. The gate of the nMOS transistor MN31 is connected to the drain of the nMOS transistor MN31 and the gate of the nMOS transistor MN32. The source of the nMOS transistor MN31 and the source of the nMOS transistor MN32 are grounded.

The source-grounded amplifier circuit 40 is configured to include a pMOS transistor MP41 and an nMOS transistor MN41. The source of the pMOS transistor MP41 is connected to the high voltage source, and the drain of the pMOS transistor MP41 is connected to the drain of the nMOS transistor MN41. The gate of the nMOS transistor MN41 is connected to a connection point of the drain of the pMOS transistor MP33 and the drain of the nMOS transistor MN32, and the source of the nMOS transistor MN41 is grounded. A connection point of the drain of the pMOS transistor MP41 and the drain of the nMOS transistor MN41 is connected to a terminal T2. In this case, the differential amplifier circuit 30 and the source-grounded amplifier circuit 40 constitute a two-stage amplifier circuit.

In the level converter circuit 1, the input signal IN is inputted to the gate of the pMOS transistor MP33, and the input signal INB is inputted to the gate of the pMOS transistor MP32. A feature of the level converter circuit 1 resides in the current generator circuit 10 that utilizes the input signal IN and the input signal INB. The current generator circuit 10 generates the current $I_{41}$ (also referred to as a control current $I_{41}$) only when the signal level of the input signal IN changes. The current detector circuit 20 detects the current $I_{41}$ and generates a control voltage Vctrl, then controls the current $I_{42}$ (also referred to as an operating current $I_{42}$) flowing through the differential amplifier circuit 30 and the current $I_{43}$ (also referred to as an operating current $I_{43}$) flowing through the source-grounded amplifier circuits 40, via the current mirror circuit, so that they correspond to the current $I_{41}$. When the corresponding currents $I_{42}$ and $I_{43}$ are supplied, the differential amplifier circuit 30 and the source-grounded amplifier circuit 40 execute level conversion by amplifying the input signal IN of a small amplitude to the output signal OUT of a large amplitude and outputting the resulting signal. The operation of the level converter circuit 1 will be described in detail below.

The level converter circuit 1 is configured to include the two-stage amplifier circuit of the differential amplifier circuit 30 and the source-grounded amplifier circuit 40, the current generator circuit 10, the current detector circuit 20 and the preprocessing circuit 50. A case where the currents $I_{42}$ and $I_{43}$ corresponding to the current $I_{41}$ generated by the current generator circuit 10 are supplied to the differential amplifier circuit 30 and the source-grounded amplifier circuit 40, respectively, is considered. When the voltage of the input signal IN is higher than the voltage of the input signal INB, the output signal OUT becomes the second high level. On the other hand, when the voltage of the input signal IN is lower than the voltage of the input signal INB, the output signal OUT become the low level. Since the input signal IN and the input signal INB have a complementary relation of the first high level or the low level, the input signal INB becomes the low level from the first high level, and the output signal OUT rises from the low level to the second high level when the input signal IN becomes the first high level from the low level.

Figure 2:
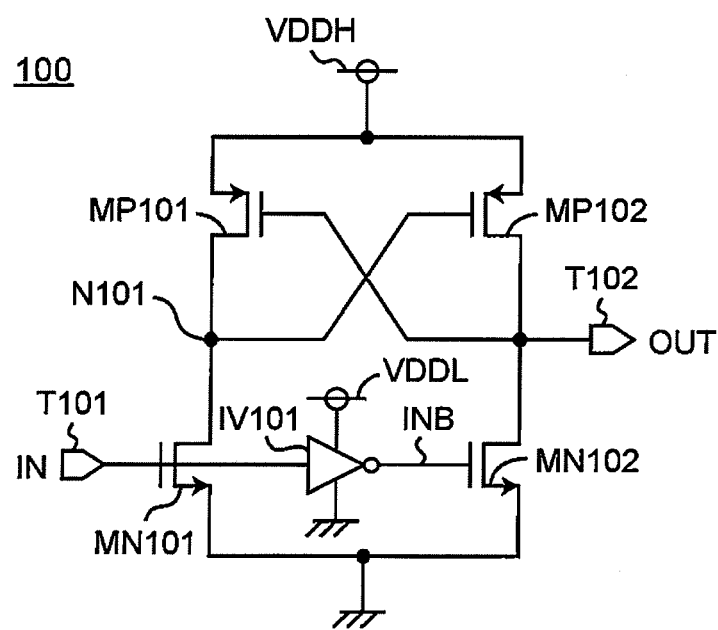
FIG. 2 is a circuit diagram showing a configuration of the prior art cross-coupled level converter circuit 100.

In this case, attention is paid to charging and discharging currents at the terminal T2. The logic value (signal level) of the output signal OUT is determined by charging and discharging the terminal T2 with the charging and discharging currents flowing through the pMOS transistor MP41 and the nMOS transistor MN41. The gate voltages of the pMOS transistor MP41 and the nMOS transistor MN41 taking charge of charging and discharging are determined by the current $I_{41}$ generated by the current generator circuit 10. Therefore, it is not necessary to strictly striking a balance of the amounts of currents flowing through the pMOS transistor MP41 and the nMOS transistor MN41. That is, the level converter circuit 1 has tolerances to a voltage difference between the high power supply voltage VDDH and the low power supply voltage VDDL, process variations, and temperature changes as compared with the prior art level converter circuit 100 shown in FIG. 2.

The differential amplifier circuit 30 and the source-grounded amplifier circuit 40 normally operate by utilizing a current generated from a reference current generator circuit. However, it is not preferable that a current regularly flows because it increases power consumption. In general, the level converter circuit 1 is required to operate at high speed only when the voltage of the input signal IN changes. That is, by generating a current that flows through the differential amplifier circuit 30 and the source-grounded amplifier circuit 40 only when the voltage of the input signal IN changes and generating no current when the voltage of the input signal IN does not change, low power consumption of the level converter circuit 1 can be achieved. Therefore, the current generator circuit 10 for the above purpose was considered.

Figure 4:
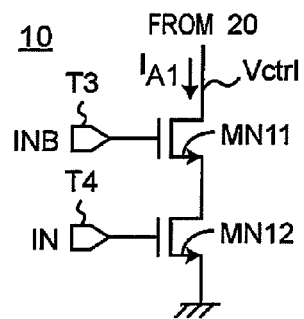
FIG. 4 is a block diagram showing a configuration of the current generator circuit 10 of FIG. 3B.

FIG. 4 is a block diagram showing a configuration of the current generator circuit 10 of FIG. 3B. The current generator circuit 10 is configured to include nMOS transistors MN11 and MN12. The drain of the nMOS transistor MN11 is connected to the current detector circuit 20, and the gate of the nMOS transistor MN11 is connected to a terminal T3. The input signal INB is inputted to the terminal T3 from the preprocessing circuit 50. The source of the nMOS transistor MN11 is connected to the drain of the nMOS transistor MN12. The gate of the nMOS transistor MN12 is connected to a terminal T4. The terminal T4 is connected to the terminal T1, and the input signal IN is inputted to the terminal T4. The source of the nMOS transistor MN12 is grounded. It is noted that the current generator circuit 10 may be configured by inputting the input signal IN to the terminal T3 and inputting the signal INB to the terminal T4.

Referring to FIG. 4, the two nMOS transistors MN11 and MN12 are connected in cascade, the input signal INB is applied to the gate of the nMOS transistor MN11, and the input signal IN is applied to the gate of the nMOS transistor MN12 in the current generator circuit 10. In this case, since the signal levels of the input signals INB and IN change with a limited delay time, there is a period or time interval during which both the input signals INB and IN have limited voltages. For this period, the nMOS transistor MN11 operates in response to the input signal INB, and the nMOS transistor MN12 operates in response to the input signal IN, and generates the current $I_{A1}$.

Figure 5:
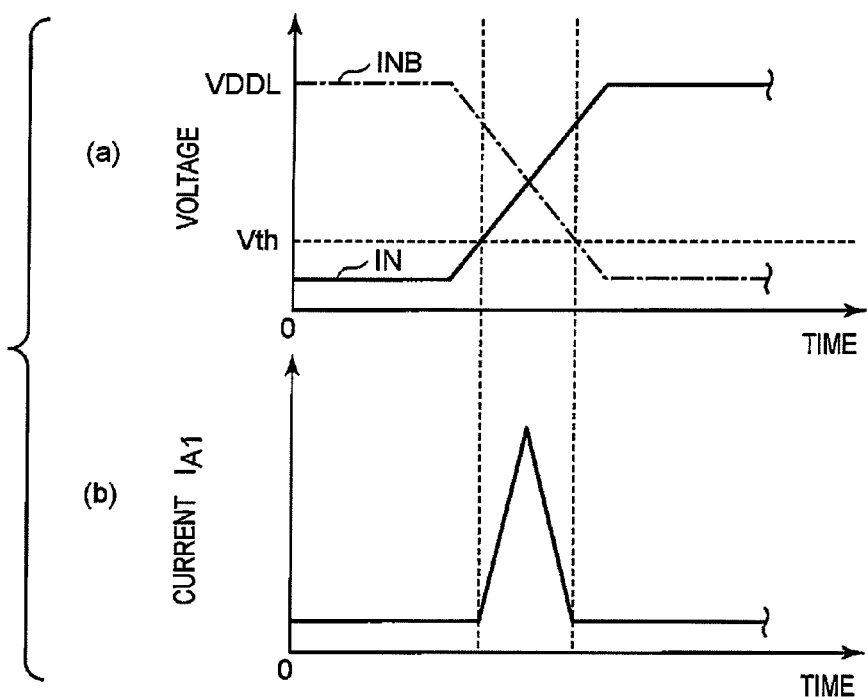
FIG. 5 is a timing chart showing timings between the voltages of an input signal IN and an input signal INB inputted to the current generator circuit 10 of FIG. 4 and a currents $I_{A1}$ generated by the current generator circuit 10, where

FIG. 5 is a timing chart showing timings between the voltages of the input signal IN and the input signal INB inputted to the current generator circuit 10 of FIG. 4 and the currents $I_{A1}$ generated by the current generator circuit 10. FIG. 5(a) shows the voltages of the input signal IN and the input signal INB, and FIG. 5(b) shows the current $I_{A1}$. When the voltage of the input signal IN changes, the voltage of the input signal INB is inverted via the preprocessing circuit 50. In this case, there is a period or time interval during which both of the voltages of the input signals IN and INB exceed a threshold voltage Vth for the period or time interval during which the signal levels of the input signals IN and INB change. For the period, the nMOS transistors MN11 and MN12 enter the ON state, and the current $I_{A1}$ is generated until either one of the input signals becomes the low level. The currents $I_{A2}$ and $I_{A3}$ corresponding to the current $I_{A1}$ are applied to the differential amplifier circuit 30 and the source-grounded amplifier circuit 40, executing the level conversion operation. When the voltage of the input signal IN does not change, the level converter circuit 1 operates only with a leakage current flowing through the nMOS transistors MN11 and MN12. Therefore, by utilizing the current generator circuit 10, the level converter circuit 1 can achieve the signal level conversion operation with low power consumption.

The delay time from the change of the input signal IN to the change of the output signal OUT depends on the current $I_{A1}$ generated by the current generator circuit 10. Therefore, the delay time can be controlled by adjusting the transistor sizes or the threshold voltages of the two nMOS transistors MN11 and MN12 connected in cascade or adjusting the current mirror ratios of the differential amplifier circuit 30 and the source-grounded amplifier circuit 40.

As described above, according to the first preferred embodiment, the signal level is converted by applying the currents $I_{A2}$ and $I_{A3}$ corresponding to the current $I_{A1}$ generated by the current generator circuit 10 to the differential amplifier circuit 30 and the source-grounded amplifier circuit 40, respectively. Therefore, even when the difference voltage between the low power supply voltage VDDL and the high power supply voltage VDDH is large, the level converter circuit 1 stably operates. Moreover, since the current $I_{A1}$ is generated only when the voltage of input signal IN changes, and the $I_{A1}$ is not generated when the voltage of the input signal IN does not change, the level converter circuit 1 operates with low power consumption.

Figure 6:
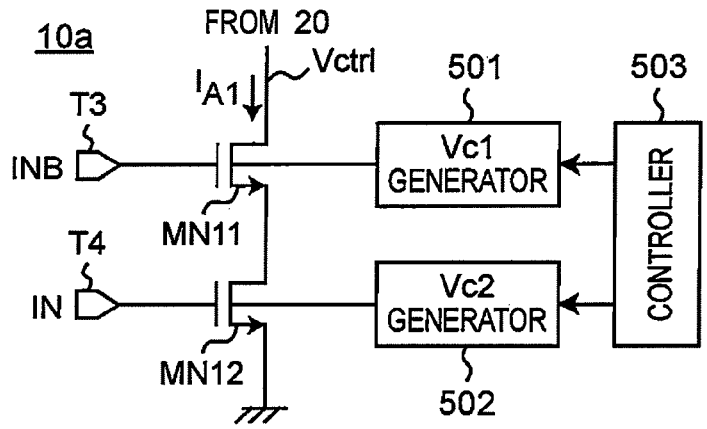
FIG. 6 is a circuit diagram showing a configuration of a current generator circuit 10a of a first modified preferred embodiment of the current generator circuit 10 of FIG. 4.

FIG. 6 is a circuit diagram showing a configuration of a current generator circuit 10a according to a first modified preferred embodiment of the current generator circuit 10 of FIG. 4. The current generator circuit 10a of FIG. 6 differs from the current generator circuit 10 of FIG. 4 in that a Vc1 generator (voltage generator) 501 that generates a voltage Vc1, a Vc2 generator (voltage generator) 502 that generates a voltage Vc2, and a controller 503 are further provided. The substrate potential (well potential) of the nMOS transistor MN11 is set to the voltage Vc1 generated by the Vc1 generator 501, and the substrate potential of the nMOS transistor MN12 is set to the voltage Vc2 generated by the Vc2 generator 502. The controller 503 controls the voltages Vc1 and Vc2 generated by the Vc1 generator 501 and the Vc2 generator 502 so that the threshold voltages of the nMOS transistors MN11 and MN12 become lower than the threshold voltages of the nMOS transistors MN11 and MN12 in the current generator circuit 10. By this operation, the current $I_{A1}$ generated by the current generator circuit 10a increases more than the current $I_{A1}$ generated by the current generator circuit 10, and the level converter circuit 1 operates at higher speed.

Figure 7:
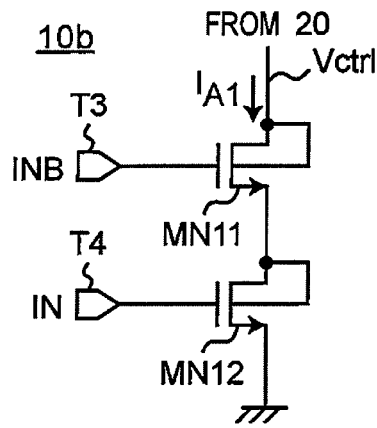
FIG. 7 is a circuit diagram showing a configuration of a current generator circuit 10b of a second modified preferred embodiment of the current generator circuit 10 of FIG. 4.

FIG. 7 is a circuit diagram showing a configuration of a current generator circuit 10b according to a second modified preferred embodiment of the current generator circuit 10 of FIG. 4. The current generator circuit 10b of FIG. 7 differs from the current generator circuit 10 of FIG. 4 in that the substrate potential of the nMOS transistor MN11 is set to a voltage identical to the voltage of the drain of the nMOS transistor MN11, and the substrate potential of the nMOS transistor MN12 is set to a voltage identical to the voltage of the drain of the nMOS transistor MN12. With this arrangement, the threshold voltages of the nMOS transistors MN11 and MN12 become lower than the threshold voltages of the nMOS transistors MN11 and MN12 in the current generator circuit 10, and the current $I_{A1}$ generated by the current generator circuit 10b increases more than the current $I_{A1}$ generated by the current generator circuit 10, so that the level converter circuit 1 operates at higher speed.

Figure 8:
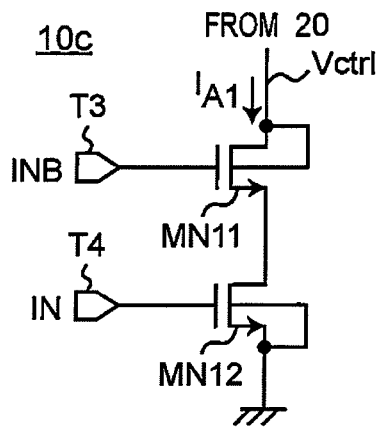
FIG. 8 is a circuit diagram showing a configuration of a current generator circuit 10c of a third modified preferred embodiment of the current generator circuit 10 of FIG. 4.

FIG. 8 is circuit diagram showing a configuration of a current generator circuit 10c according to a third modified preferred embodiment of the current generator circuit 10 of FIG. 4. The current generator circuit 10c of FIG. 8 differs from the current generator circuit 10 of FIG. 4 in that the substrate potential of the nMOS transistor MN11 is set to a voltage identical to the voltage of the drain of the nMOS transistor MN11, and the substrate potential of the nMOS transistor MN12 is set to a voltage identical to the voltage of the source of the nMOS transistor MN12. With this arrangement, the threshold voltage of the nMOS transistor MN11 become lower than the threshold voltage of the nMOS transistor MN11 in the current generator circuit 10, and the current $I_{A1}$ generated by the current generator circuit 10c increases more than the current $I_{A1}$ generated by the current generator circuit 10, so that the level converter circuit 1 operates at higher speed.

Figure 9:
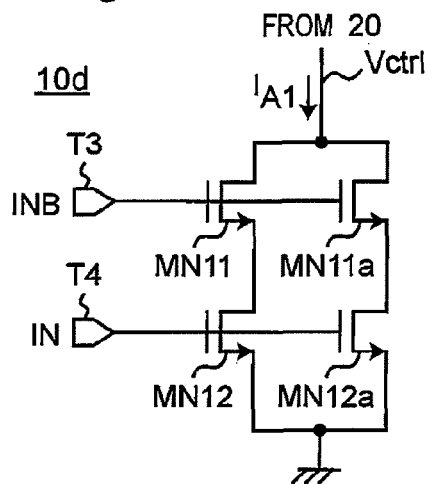
FIG. 9 is a circuit diagram showing a configuration of a current generator circuit 10d of a fourth modified preferred embodiment of the current generator circuit 10 of FIG. 4.

FIG. 9 is a circuit diagram showing a configuration of a current generator circuit 10d according to a fourth modified preferred embodiment of the current generator circuit 10 of FIG. 4. The current generator circuit 10d of FIG. 9 differs from the current generator circuit 10 of FIG. 4 in that nMOS transistors MN11a and MN12a are further provided. The drain of the nMOS transistor MN11a is connected to the current detector circuit 20, the gate of the nMOS transistor MN11a is connected to the terminal T3, and the input signal INB is inputted to its gate. The source of the nMOS transistor MN11a is connected to the drain of the nMOS transistor MN12a. The gate of the nMOS transistor MN12a is connected to the terminal T4, and the input signal IN is inputted to its gate. The source of the nMOS transistor MN12a is grounded.

Referring to FIG. 9, the nMOS transistors MN11a and MN12a are configured to have connections in a manner similar to those of the nMOS transistors MN11 and MN12 of FIG. 4. With this arrangement, a path through which the current flows in the current generator circuit 10d increases more than the current flowing through the current generator circuit 10. Therefore, the current $I_{A1}$ generated by the current generator circuit 10d increases more than the current $I_{A1}$ generated by the current generator circuit 10, so that the level converter circuit 1 operates at higher speed.

It is acceptable to increase the gate width, transistor size or channel width of the nMOS transistors MN11 and MN12 of the current generator circuit 10. With this arrangement, the current $I_{A1}$ generated by the current generator circuit 10 increases, so that the level converter circuit 1 operates at higher speed.

Second Preferred Embodiment

The operation of the level converter circuit 1 has such a problem that it strongly depends on the waveform of the input signal IN. Moreover, the level converter circuit 1 has a problem in the noise immunity in terms of the characteristics of the circuit operation. That is, there are the following two problems.

Problem A: When there is no period during which an overlap between the waveform of the input signal IN and the waveform of the input signal INB, i.e., both the input signal IN and the input signals INB have the first high level, the current generator circuit 10 does not generate the current $I_{A1}$.

Problem B: After the logic value of the output signal OUT is established, the current generator circuit 10 does not operate, and the level converter circuit 1 operates with a leakage current. Therefore, it is possible that the level converter circuit 1 has a vulnerability to disturbances such as noises.

The problem A and the problem B will be each described below.

Figure 10A:
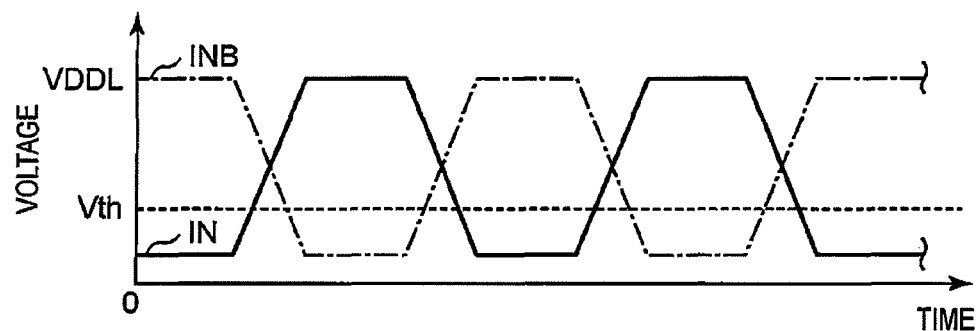
FIG. 10A is a graph showing waveforms of ideal input signals IN and INB to the level converter circuit 1 of FIG. 3B.
Figure 10B:
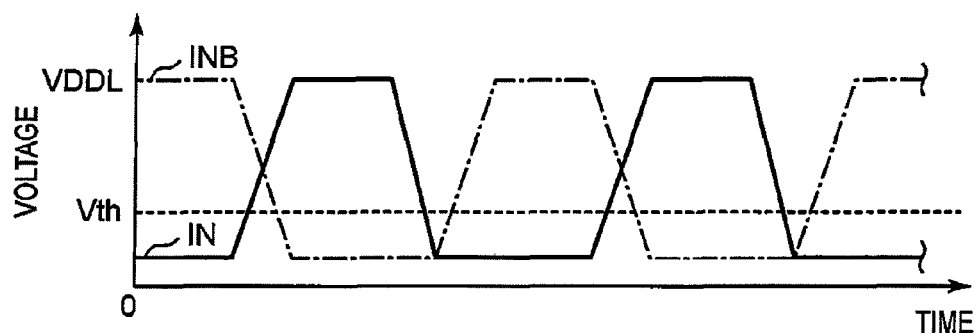
FIG. 10B is a graph showing waveforms of non-ideal input signals IN and INB to the level converter circuit 1 of FIG. 3B.

First of all, the problem A will be described. FIG. 10A is a graph showing ideal waveforms of the input signals IN and INB to the level converter circuit 1 of FIG. 3B, and FIG. 10B is a graph showing non-ideal waveforms of the input signals IN and INB to the level converter circuit 1 of FIG. 3B. The level converter circuit 1 detects a voltage domain in which the logic values of the input signal IN and the input signal INB overlap each other by the nMOS transistors MN11 and MN12 connected in cascade, and operates by generating the current $I_{A1}$. As apparent from FIG. 10A, in the case of the ideal waveforms of the input signals IN and INB, there is a period or time interval during which both the input signals INB and IN have limited voltages, i.e., both of them have the high level for the period or time interval during which the logic values of the input signals INB and IN change. The nMOS transistors MN11 and MN12 enter the ON state for this period, generating the current $I_{A1}$ for operating the level converter circuit 1. On the other hand, in the case of the non-ideal waveforms of the input signals IN and INB shown in FIG. 10B, the waveforms of the input signal IN and the input signal INB overlap each other at the rise of the input signal IN, whereas the waveforms of the input signal IN and the input signal INB do not overlap each other at the fall of the input signal IN. This means that the current generator circuit 10 cannot generate a sufficient current $I_{A1}$ at the fall of the input signal IN, and this leads to such a problem that it is impossible to guarantee the stable operation of the level converter circuit 1.

The problem B will be next described. In the level converter circuit 1, the current generator circuit 10 operates only when the logic value of the output signal OUT changes, generating the current $I_{A1}$. The differential amplifier circuit 30 and the source-grounded amplifier circuit 40 are operated by the currents $I_{A2}$ and $I_{A3}$ corresponding to the current $I_{A1}$, and achieves the level conversion operation. However, considering time after the change in the logic value of the output signal OUT, the terminal T2 enters a floating state, and this leads to a vulnerability to disturbances such as noises. That is, there is such a problem that, even if the output signal OUT falls from the second high level due to influences of noises and the like for the period during which the level converter circuit 1 should output the output signal OUT of the second high level, this phenomenon cannot be corrected. Moreover, there is such a problem that, even if the output signal OUT rises from the low level due to influences of noises and the like for the period during which the level converter circuit 1 should output the output signal OUT of the low level, this phenomenon cannot be corrected.

A level converter circuit 1A according to the second preferred embodiment solves the aforementioned problems A and B. The level converter circuit 1A solves the aforementioned problems A and B by introducing a feedback control system into the fundamental structure of the level converter circuit 1.

Figure 11A:
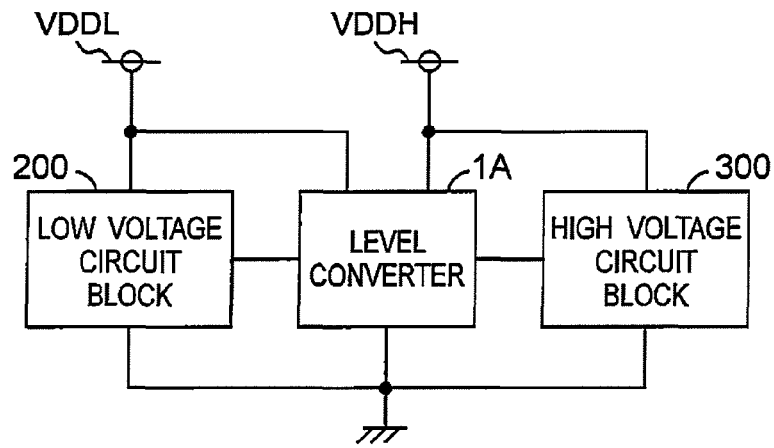
FIG. 11A is a block diagram showing an application example of a level converter circuit 1A according to a second preferred embodiment of the present invention.

FIG. 11A is a block diagram showing an application example of the level converter circuit 1A of the second preferred embodiment of the present invention. Referring to FIG. 11A, the level converter circuit 1A converts the signal level of a signal from the low voltage circuit block 200 to which the low power supply voltage VDDL (e.g., 0.4 V) is supplied, and outputs the resulting signal to the high voltage circuit block 300 to which the high power supply voltage VDDH (e.g., 3 V) is supplied. Hereinafter, the input signals IN and INB, the first high level, the second high level, the low voltage source and the high voltage source are similar to the input signals IN and INB, the first high level, the second high level, the low voltage source and the high voltage source, respectively, described in the first preferred embodiment.

Figure 11B:
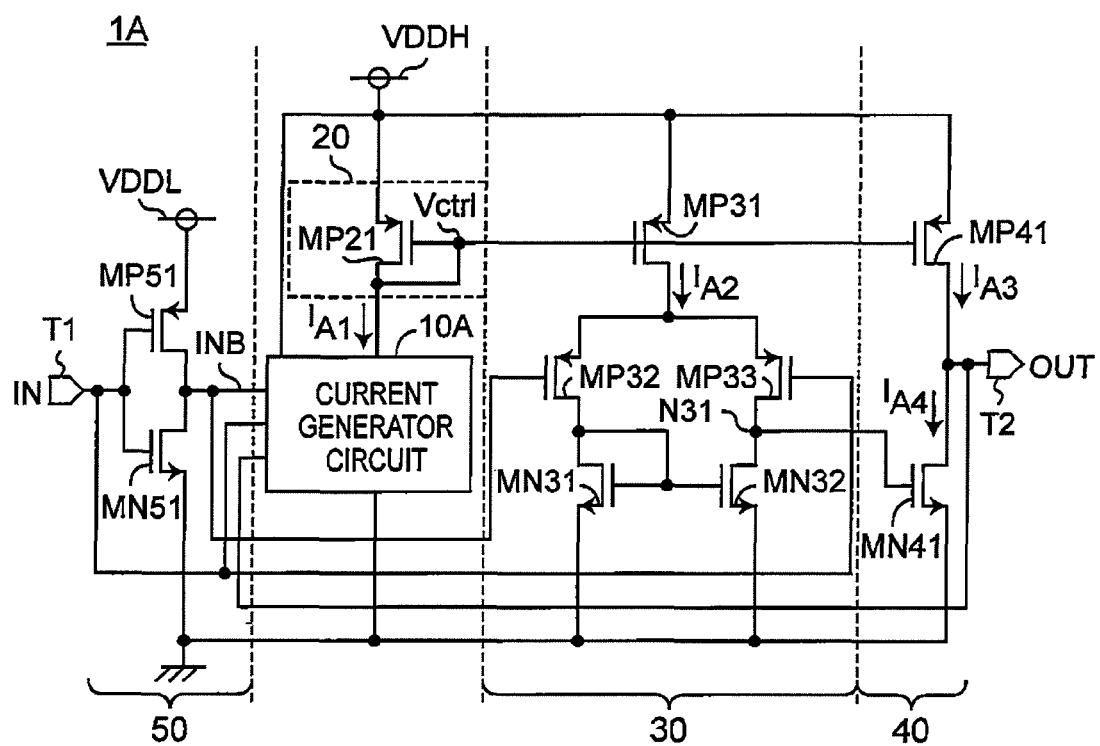
FIG. 11B is a block diagram showing a configuration of the level converter circuit 1A of the second preferred embodiment of the present invention.

FIG. 11B is a block diagram showing a configuration of the level converter circuit 1A of the second preferred embodiment of the present invention. Referring to FIG. 11B, the level converter circuit 1A differs from the level converter circuit 1 of the first preferred embodiment in that a current generator circuit 10A is provided in place of the current generator circuit 10, and the other components are similar to those of the level converter circuit 1, for which no description is provided. As shown in FIG. 11B, the output signal OUT is inputted to the current generator circuit 10A, and the feedback control is executed.

Figure 12:
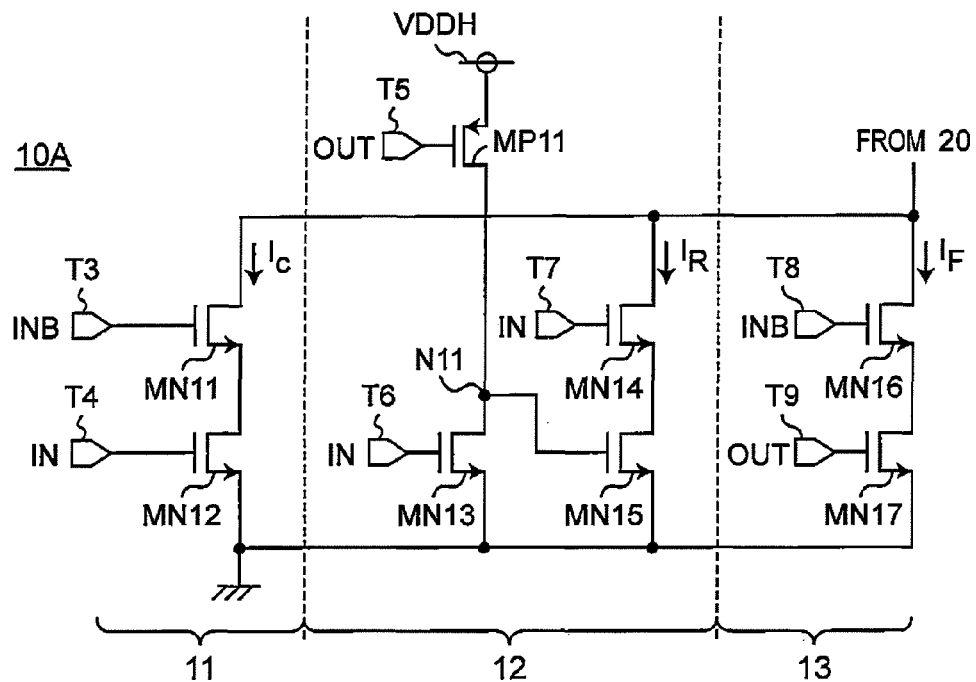
FIG. 12 is a circuit diagram showing a configuration of the current generator circuit 10A of FIG. 11B.

FIG. 12 is a circuit diagram showing a configuration of the current generator circuit 10A of FIG. 11B. The current generator circuit 10A is configured to include a change current generator circuit 11, a rise current generator circuit 12, and a fall current generator circuit 13.

The change current generator circuit 11 has a configuration similar to that of the current generator circuit 10 of FIG. 4, and operates likewise. The rise current generator circuit 12 monitors the rise of the input signal IN, and the fall current generator circuit 13 monitors the fall of the input signal IN. In this case, a current generated by the change current generator circuit 11 is assumed to be a current $I_C$ (also referred to as a control current $I_C$), a current generated by the rise current generator circuit 12 is assumed to be a current $I_R$ (also referred to as a control current $I_R$), and a current generated by the fall current generator circuit 13 is assumed to be a current $I_F$ (also referred to as a control current $I_F$). The rise current generator circuit 12 and the fall current generator circuit 13 will be described below.

The rise current generator circuit 12 is configured to include a pMOS transistor MP11, nMOS transistors MN13, MN14 and MN15, and terminals T5, T6 and T7. The source of the pMOS transistor MP11 is connected to the high voltage source, the gate of the pMOS transistor MP11 is connected to the terminal T5, and the output signal OUT is inputted to its gate. The drain of the pMOS transistor MP11 is connected to the drain of an nMOS transistor MN13. The gate of the nMOS transistor MN13 is connected to the terminal T6, and the input signal IN is inputted to its gate. The source of the nMOS transistor MN13 is grounded. Moreover, a connection point of the drain of the pMOS transistor MP11 and the drain of the nMOS transistor MN13 is referred to as a node N11. The drain of the nMOS transistor MN14 is connected to the current detector circuit 20, the gate of the nMOS transistor MN14 is connected to the terminal T7, and the input signal IN is inputted to its gate. The source of the nMOS transistor MN14 is connected to the drain of the nMOS transistor MN15. The gate of the nMOS transistor MN15 is connected to the node N11, and the source of the nMOS transistor MN15 is grounded. In this case, the terminal T5 is connected to the terminal T2, and the terminal T6 and the terminal T7 are connected to the terminal T1.

The rise current generator circuit 12 is implemented by a two-stage configuration. In the circuit of the first stage, the pMOS transistor MP11 monitors the output signal OUT, and the nMOS transistor MN13 monitors the input signal IN. In the circuit of the second stage, the nMOS transistors MN14 and MN15 are connected in cascade, the nMOS transistor MN15 monitors the voltage at the node N11, and the nMOS transistor MN14 monitors the input signal IN. With this circuit configuration, the pMOS transistor MP11 operates in response to the output signal OUT, the nMOS transistors MN13 and MN14 operate in response to the input signal IN, and the nMOS transistor MN15 operates in response to the voltage at the node N11. Moreover, the rise current generator circuit 12 operates only when the input signal IN has first high level and the output signal OUT has the low level, and generates the current $I_R$ for correction so that the output signal OUT becomes the second high level.

When the input signal IN has the first high level and the output signal OUT has the second high level, the voltage at the node N11 becomes the low level. Therefore, the nMOS transistor MN15 enters the OFF state, and the circuit of the second stage does not generate the current $I_R$. When the input signal IN has the first high level and the output signal OUT has the low level, i.e., when the logic values of the input signal IN and the output signal OUT do not coincide with each other, the voltage at the node N11 becomes the high level to turn on the nMOS transistor MN15, and the circuit of the second stage generates the current $I_R$. The amount of current of the current $I_R$ is defined by the voltage of the input signal IN, i.e., the low power supply voltage VDDL.

The fall current generator circuit 13 is configured to include nMOS transistors MN16 and MN17, and terminals T8 and T9. The drain of the nMOS transistor MN16 is connected to the current detector circuit 20, the gate of the nMOS transistor MN16 is connected to the terminal T8, and the input signal INB is inputted to its gate. The source of the nMOS transistor MN16 is connected to the drain of the nMOS transistor MN17. The gate of the nMOS transistor MN17 is connected to the terminal T9, and the output signal OUT is inputted to its gate. The source of the nMOS transistor MN17 is grounded. In this case, the input signal INB is inputted to the terminal T8 from the preprocessing circuit 50, and the terminal T9 is connected to the terminal T2.

The fall current generator circuit 13 is implemented by a one-stage configuration. The nMOS transistors MN16 and MN17 are connected in cascade, the nMOS transistor MN17 monitors the output signal OUT, and the nMOS transistor MN16 monitors the input signal INB. With this circuit configuration, the nMOS transistor MN16 operates in response to the input signal INB, and the nMOS transistor MN17 operates in response to the output signal OUT. Moreover, when the fall current generator circuit 13 operates only when the input signal IN has the low level (in this case, the input signal INB has the first high level) and the output signal OUT has the second high level, generating the current $I_F$ for correction so that the output signal OUT becomes the low level.

When the input signal IN has the low level and the output signal OUT has the low level, the fall current generator circuit 13 does not operate. When the input signal IN has the low level and the output signal OUT has the second high level, i.e., when the logic values of the input signal IN and the output signal OUT do not coincide with each other, the fall current generator circuit 13 generates the current $I_F$. The amount of current of the current $I_F$ is defined by the voltage of the input signal INB, i.e., the low power supply voltage VDDL.

First of all, operation of the current generator circuit 10A when the input signal IN has the first high level (the input signal INB has the low level) will be described below. Reference is first made to a case where the output signal OUT has the second high level. In this case, the logic values of the input signal IN and the output signal OUT coincide with each other. Since the nMOS transistor MN11 is in the OFF state, the change current generator circuit 11 does not generate the current $I_C$. Moreover, since the pMOS transistor MP11 is in the OFF state and the nMOS transistor MN13 is in the ON state, the voltage at the node N11 of the rise current generator circuit 12 is lowered to the ground voltage. The nMOS transistor MN15 enters the OFF state in response to the voltage at the node N11. Therefore, the rise current generator circuit 12 does not generate the current $I_R$. Further, since the nMOS transistor MN16 is in the OFF state, the fall current generator circuit 13 does not generate the current $I_F$. Therefore, when the input signal IN has the first high level and the output signal OUT has the second high level, the current generator circuit 10A generates no current.

Reference is next made to a case where the output signal OUT has the low level. In this case, the logic values of the input signal IN and the output signal OUT do not coincide with each other. Since the nMOS transistor MN11 is in the OFF state, the change current generator circuit 11 does not generate the current $I_C$. Moreover, in the rise current generator circuit 12, the pMOS transistor MP11 enters the ON state, and the voltage at the node N11 rises to the high power supply voltage VDDH. The nMOS transistor MN15 enters the ON state in response to the voltage at the node N11, thereby generating the current $I_R$. Further, since the nMOS transistor MN16 is in the OFF state, the fall current generator circuit 13 does not generate the current $I_F$. Therefore, when the input signal IN has the first high level and the output signal OUT has the low level, the current generator circuit 10A generates the current $I_R$.

Next, operation of the current generator circuit 10A when the input signal IN has the low level (the input signal INB has the first high level) will be described below. Reference is first made to a case where the output signal OUT has the low level. In this case, the logic values of the input signal IN and the output signal OUT coincide with each other. Since the nMOS transistor MN12 is in the OFF state, the change current generator circuit 11 does not generate the current $I_C$. Moreover, since the pMOS transistor MP11 is in the ON state and the nMOS transistor MN13 is in the OFF state in the rise current generator circuit 12, the voltage at the node N11 rises to the high power supply voltage VDDH. The nMOS transistor MN15 is in the ON state in response to the voltage at the node N11, whereas the nMOS transistor MN14 is in the OFF state since the input signal IN has the low level. Therefore, the rise current generator circuit 12 does not generate the current $I_R$. Further, since the nMOS transistor MN17 is in the OFF state, the fall current generator circuit 13 does not generate the current $I_F$. Therefore, when the input signal IN has the low level and the output signal OUT has the low level, the current generator circuit 10A generates no current.

Next, reference is made to a case where the output signal OUT has the second high level. In this case, the logic values of the input signal IN and the output signal OUT do not coincide with each other. Since the nMOS transistor MN12 is in the OFF state, the change current generator circuit 11 does not generate the current $I_C$. Moreover, in the rise current generator circuit 12, the pMOS transistor MP11 enters the OFF state, and the node N11 enters the floating state. However, the nMOS transistor MN14 enters the OFF state since the input signal IN has the low level, and therefore, the rise current generator circuit 12 does not generate the current $I_R$. Moreover, since the nMOS transistors MN16 and MN17 enter the ON state, the fall current generator circuit 13 generates the current $I_F$. Therefore, when the input signal IN has the low level and the output signal OUT has the second high level, the current generator circuit 10A generates the current $I_F$.

Further, the effects of the level converter circuit 1A regarding the aforementioned problems A and B of the level converter circuit 1 are considered.

First of all, the problem A will be described. When there is no period during which both the input signal IN and the input signal INB become the first high level, the current generator circuit 10 cannot correctly generate a current. In this case, the logic values of the input signal IN and the output signal OUT do not coincide with each other. In contrast to this, the logical inconsistency can be solved by using the current generator circuit 10A. That is, when there is a logical inconsistency such that the input signal IN has the first high level and the output signal OUT has the low level, the rise current generator circuit 12 generates the current $I_R$. Moreover, when there is a logical inconsistency such that the input signal IN has the low level and the output signal OUT has the second high level, the fall current generator circuit 13 generates the current $I_F$. By this operation, the current generator circuit 10A generates a current when there is the logical inconsistency, and it is possible to establish the output of the correct logic values.

This means that the level converter circuit 1A can cope with the non-ideal waveforms of the input signals IN and INB shown in FIG. 10B. Moreover, in the case of non-ideal waveforms different from FIG. 10B, i.e., when the waveforms of the input signal IN and the input signal INB do not overlap at the rise of the input signal IN, and also when the waveforms of the input signal IN and the input signal INB do not overlap at the rise and fall of the input signal IN, the level converter circuit 1A normally operates.

Next, the problem B will be described. A case where the logic value of the input signal IN is the first high level, and the logic value of the output signal OUT is the second high level, i.e., the logic values coincide with each other at the high level is considered. In this case, the terminal T2 is charged with a leakage current, and the terminal T2 enters a high impedance state. In this case, a case where the voltage of the output signal OUT is lowered by the disturbances such as external noises is considered. When the voltage of the output signal OUT is gradually lowered, the pMOS transistor MP11 of the rise current generator circuit 12 that monitors the output signal OUT generates a current corresponding to the lowering of the voltage of the output signal OUT, and the voltage at the node N11 gradually rises. In accordance with this, the nMOS transistor MN15 that monitors the voltage at the node N11 starts generating the current $I_R$. As described above, when the voltage of the output signal OUT is lowered, the current $I_R$ is generated by the rise current generator circuit 12, and a current is supplied to the differential amplifier circuit 30 and the source-grounded amplifier circuit 40 so that the lowering of the voltage of the output signal OUT is avoided.

Next, a case where the logic value of the input signal IN is the low level, and the logic value of the output signal OUT is the low level, i.e., the logic values coincide with each other at the low level is considered. In this case, the terminal T2 is discharged with a leakage current, and the terminal T2 enters the high impedance state. In this case, a case where the voltage of the output signal OUT is raised by disturbances such as external noises is considered. When the voltage of the output signal OUT gradually rises, the nMOS transistor MN17 of the fall current generator circuit 13 that monitors the output signal OUT generates a current corresponding to a rise in the voltage of the output signal OUT. Moreover, since the input signal INB having the first high level is applied to the gate of the nMOS transistor MN16, the nMOS transistor MN16 is in the ON state. As described above, when the voltage of the output signal OUT rises, the current $I_F$ is generated by the fall current generator circuit 13, and a current is supplied to the differential amplifier circuit 30 and the source-grounded amplifier circuit 40 so that a rise in the voltage of the output signal OUT is avoided.

As described above, according to the second preferred embodiment, operative effects similar to those of the first preferred embodiment are produced. Moreover, also when the period during which both the input signal IN and the input signals INB have the first high level does not exist, the rise current generator circuit 12 generates the current $I_R$ or the fall current generator circuit 13 generates the current $I_F$, and therefore, the level converter circuit 1A normally operates. Further, also when the voltage of the output signal OUT changes due to disturbances such as external noises, the rise current generator circuit 12 generates the current $I_R$ or the fall current generator circuit 13 generates the current $I_F$, and therefore, the level converter circuit 1A normally operates.

Although the current generator circuit 10A is configured by providing the rise current generator circuit 12 and the fall current generator circuit 13 in the second preferred embodiment, the present invention is not limited to this, and it is acceptable to constitute the current generator circuit 10A by providing either one of the rise current generator circuit 12 and the fall current generator circuit 13.

Third Preferred Embodiment

Figure 13A:
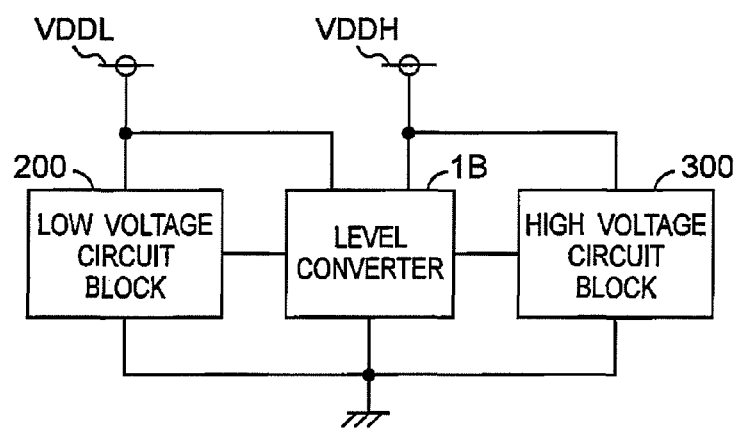
FIG. 13A is a block diagram showing an application example of a level converter circuit 1B according to a third preferred embodiment of the present invention.

FIG. 13A is a block diagram showing an application example of a level converter circuit 1B according to the third preferred embodiment of the present invention. Referring to FIG. 13A, the level converter circuit 1B converts the signal level of a signal from the low voltage circuit block 200 to which the low power supply voltage VDDL (e.g., 0.4 V) is supplied, and outputs the resulting signal to the high voltage circuit block 300 to which the high power supply voltage VDDH (e.g., 3V) is supplied. Hereinafter, the input signals IN and INB, the first high level, the second high level, the low voltage source and the high voltage source are similar to the input signals IN and INB, the first high level, the second high level, the low voltage source and the high voltage source described in the first preferred embodiment.

Figure 13B:
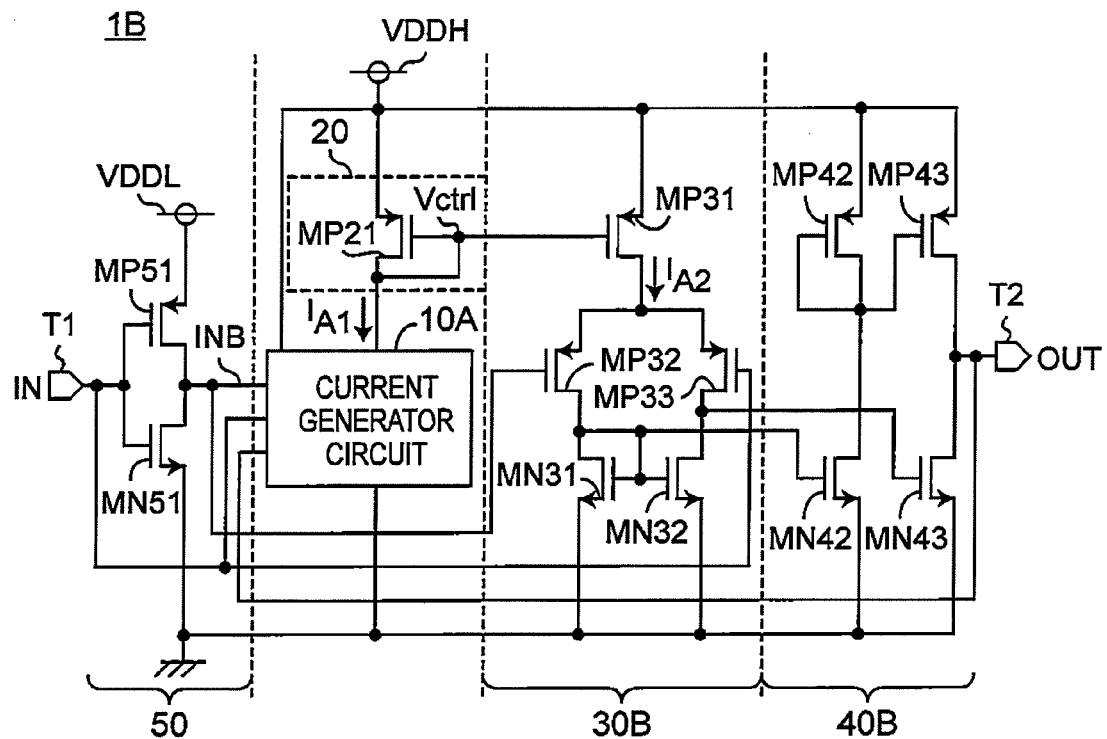
FIG. 13B is a block diagram showing a configuration of the level converter circuit 1B of the third preferred embodiment of the present invention.

FIG. 13B is a block diagram showing a configuration of the level converter circuit 1B of the third preferred embodiment of the present invention. The level converter circuit 1A of the second preferred embodiment has had such a problem that the characteristic of the current $I_F$ cannot sufficiently be evaluated.

The level converter circuit 1B differs from the level converter circuit 1A in that a differential amplifier circuit 30B is provided in place of the differential amplifier circuit 30 and a push-pull type source-grounded amplifier circuit 40B is provided in place of the source-grounded amplifier circuit 40. The other components are similar to those of the level converter circuit 1A, and no description is provided therefor.

The differential amplifier circuit 30B differs from the differential amplifier circuit 30 in that a connection point of the drain of the pMOS transistor MP32 and the drain of the nMOS transistor MN31 is connected to the gate of the nMOS transistor MN42, and a connection point of the drain of the pMOS transistor MP33 and the drain of the nMOS transistor MN32 is connected to the gate of the nMOS transistor MN43. The other components and operations are similar to those of the differential amplifier circuit 30.

The push-pull type source-grounded amplifier circuit 40B is configured to include pMOS transistors MP42 and MP43, and nMOS transistors MN42 and MN43. The source of the pMOS transistor MP42 is connected to the high voltage source, and the gate of the pMOS transistor MP42 is connected to the drain of the pMOS transistor MP42 and the gate of the pMOS transistor MP43. The drain of the pMOS transistor MP42 is connected to the drain of the nMOS transistor MN42. The gate of the nMOS transistor MN42 is connected to a connection point of the drain of the pMOS transistor MP32 and the drain of the nMOS transistor MN31, and the source of the nMOS transistor MN42 is grounded. The source of the pMOS transistor MP43 is connected to the high voltage source, and the drain of the pMOS transistor MP43 is connected to the drain of the nMOS transistor MN43. The gate of the nMOS transistor MN43 is connected to a connection point of the drain of the pMOS transistor MP33 and the drain of nMOS transistor MN32, and the source of the nMOS transistor MN43 is grounded. A connection point of the drain of the pMOS transistor MP43 and the drain of the nMOS transistor MN43 is connected to the terminal T2. In this case, the differential amplifier circuit 303 and the push-pull type source-grounded amplifier circuit 40B constitute a two-stage amplifier circuit.

The push-pull type source-grounded amplifier circuit 40B, which is configured as described above, is able to charge or discharge the terminal T2 with a current corresponding to the current generated by the current generator circuit 10A both at the rise and the fall of the output signal OUT.

As described above, according to the third preferred embodiment, operative effects similar to those of the second preferred embodiment are produced.

Although the level converter circuit 1 and the level converter circuit 1A have been configured to include the differential amplifier circuit 30 and the source-grounded amplifier circuit 40, respectively, in the first and second preferred embodiments, the present invention is not limited to this, and it is acceptable to constitute the level converter circuit 1 and the level converter circuit 1A of the differential amplifier circuit 30B and the push-pull type source-grounded amplifier circuit 40B.

First Implemental Example

A simulation evaluation (first implemental example) of the level converter circuit 1 of the first preferred embodiment will be described below. Results of a SPICE simulation evaluation regarding the level converter circuit 1 of FIG. 3B are shown. In this case, a 0.35-μm CMOS process was used. The low power supply voltage VDDL was set to 0.4 to 0.8 V, and the high power supply voltage VDDH was set to 3 V.

Figure 14:
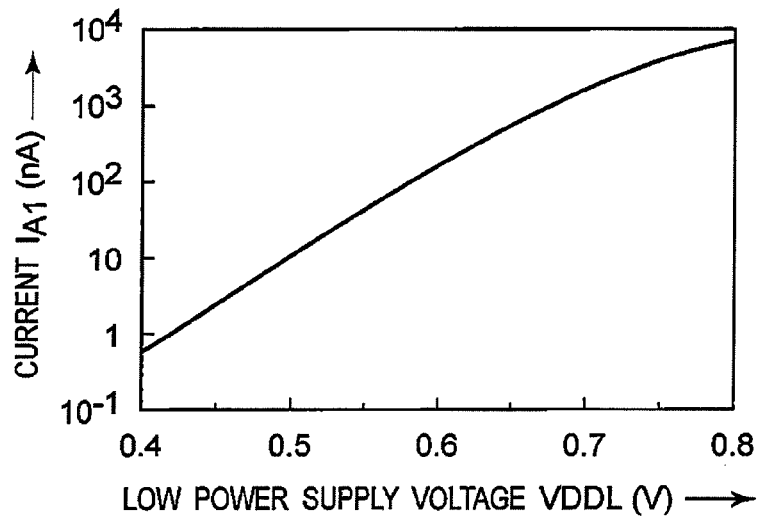
FIG. 14 is a graph showing dependency of a peak current generated by the current generator circuit 10 of FIG. 4 on a low power supply voltage VDDL.

The present inventors conducted a simulation evaluation of the current generator circuit 10. FIG. 14 is a graph showing dependency of a peak current generated by the current generator circuit 10 of FIG. 4 on the low power supply voltage VDDL. FIG. 14 shows the peak current value of the current $I_{A1}$ generated by the current generator circuit 10 when the low power supply voltage VDDL is changed from 0.4 V to 0.8 V. It can be confirmed that the peak current exponentially increases in accordance with a rise in the low power supply voltage VDDL. This is because the nMOS transistors MN11 and MN12 connected in cascade of the current generator circuit 10 operate in the subthreshold region below the threshold voltage when the low power supply voltage VDDL is a low voltage, and the gate voltages of the nMOS transistors MN11 and MN12 rise when the low power supply voltage VDDL rises, as a consequence of which the current flowing through the nMOS transistors MN11 and MN12 exponentially increases.

The current $I_{A1}$ generated by the current generator circuit 10 is supplied to the differential amplifier circuit 30 and the source-grounded amplifier circuit 40 via a current mirror circuit as configured to include the pMOS transistors MP21, MP31 and MP41. As shown in FIG. 5, the current $I_{A1}$ generated by the current generator circuit 10 becomes a pulse current, and this therefore leads to a problem of the current supply accuracy via the current mirror circuit. Accordingly, the frequency characteristics of the current $I_{A2}$ supplied to the differential amplifier circuit 30 and the current $I_{A3}$ supplied to the source-grounded amplifier circuit 40 were evaluated.

Figure 15:
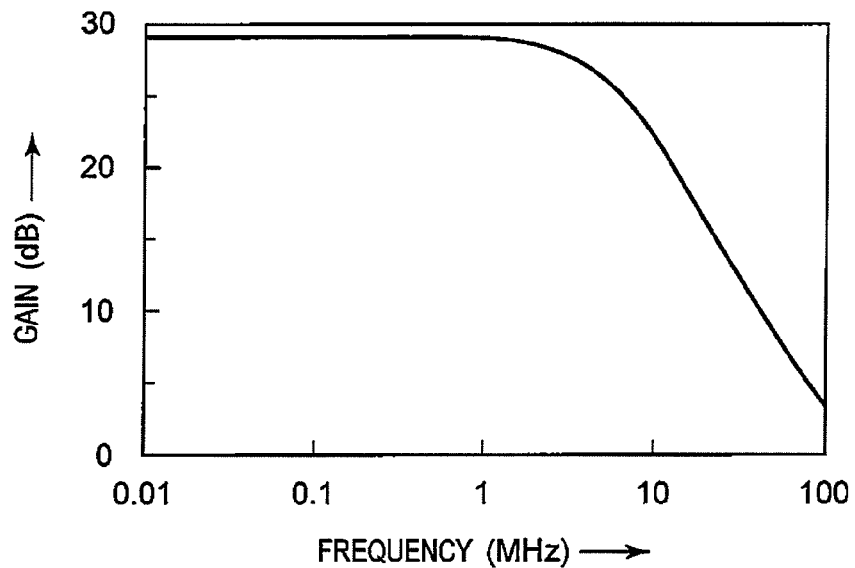
FIG. 15 is a graph showing a frequency response characteristic of the currents $I_{A2}$ and $I_{A3}$ of FIG. 3B.

FIG. 15 is a graph showing frequency response characteristics of the currents $I_{A2}$ and $I_{A3}$ of FIG. 3B. As shown in FIG. 15, it can be understood that the current mirror circuit is able to supply the currents to the differential amplifier circuit 30 and the source-grounded amplifier circuit 40 with a constant current gain maintained when the frequency of the current $I_{A1}$ is not higher than about 2 MHz. When the frequency of the current $I_{A1}$ exceeds 2 MHz, the current gain is reduced by the low-pass filter effect of the current mirror circuit. That is, the level converter circuit 1 has an operation band of several megahertz. In order to improve the operation band of the level converter circuit 1, a device to increase the amount of current of the current $I_{A1}$ generated by the current generator circuit 10 is necessary. By using current generator circuits 10a, 10b, 10c and 10d according to a modified preferred embodiment of the current generator circuit 10 described above, the amount of current of the current $I_{A1}$ generated by the current generator circuit 10 can be increased.

The present inventors conducted a simulation evaluation by setting the low power supply voltage VDDL to 0.55 V and setting the frequency of the input signal IN to 10 kHz as one example of the operation of the level converter circuit 1.

Figure 1:
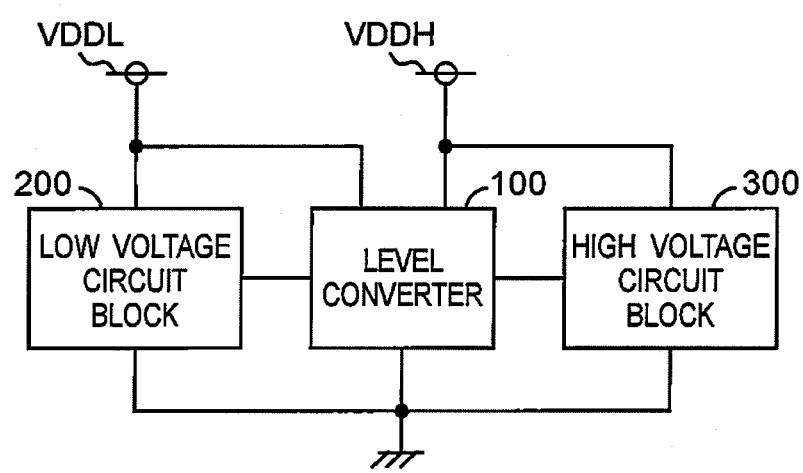
FIG. 1 is a block diagram showing an application example of a prior art level converter circuit 100.
Figure 16:
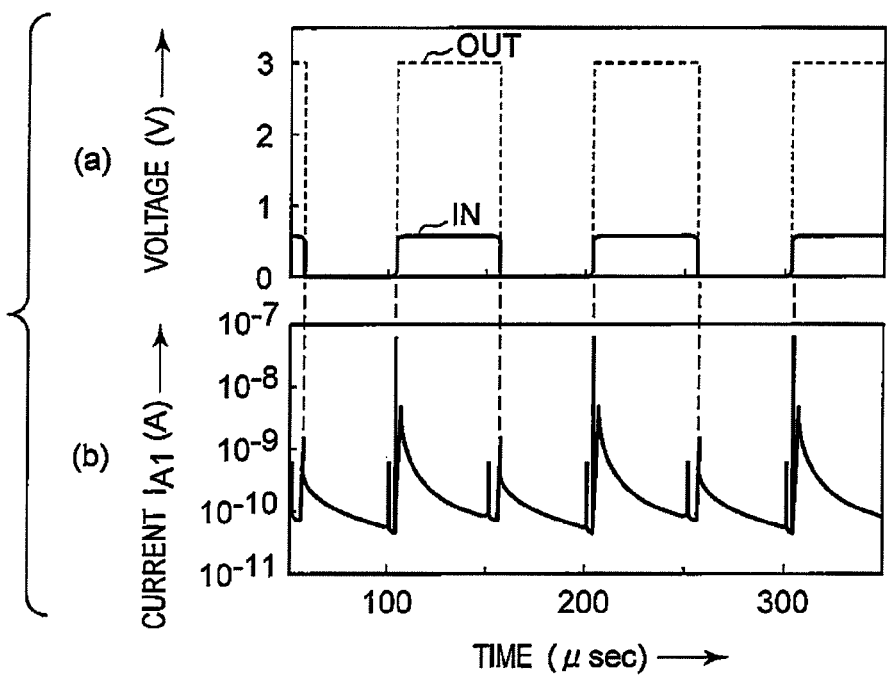
FIG. 16 is a graph showing a waveform of the input signal IN to the level converter circuit 1 of FIG. 3B, showing a waveform of an output signal OUT from the level converter circuit 1 of FIG. 3B, and showing a waveform of the current $I_{A1}$ generated by the current generator circuit 10 of FIG. 4.

FIG. 16(*a*) is a graph showing a waveform of the input signal IN to the level converter circuit 1 of FIG. 1, and showing and the waveform of the output signal OUT from the level converter circuit 1 of FIG. 1. FIG. 16(*b*) is a graph showing a waveform of the current $I_{A1}$ generated by the current generator circuit 10 of FIG. 2. As shown in FIG. 16(*a*), the output signal OUT having amplitude of 0 to 3 V is outputted in synchronization with the logic value of the input signal IN. Moreover, as shown in FIG. 16(*b*), a large current $I_{A1}$ is generated only when the logic value of the input signal IN is inverted.

Figure 17:
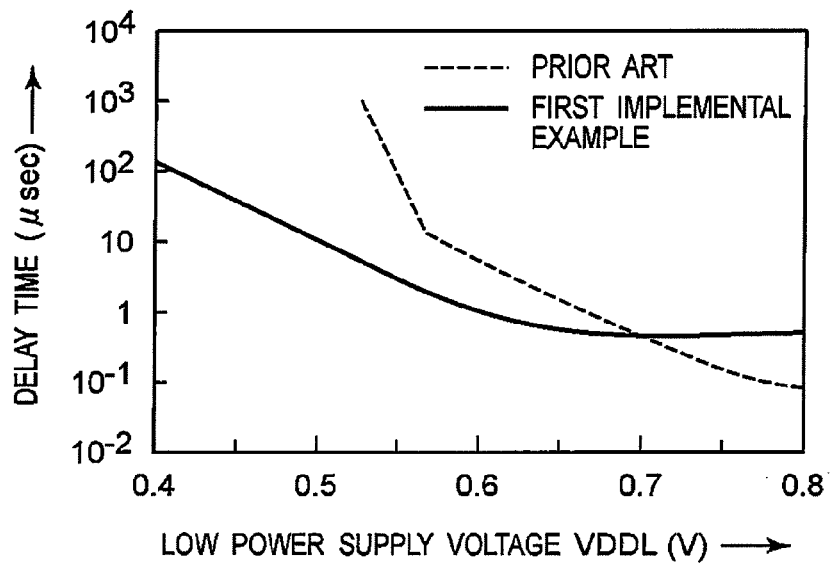
FIG. 17 is a graph showing delay times of the level converter circuit 1 of FIG. 3B and the prior art level converter circuit 100 with respect to the voltage value of the low power supply voltage VDDL.

FIG. 17 is a graph showing delay times of the level converter circuit 1 of FIG. 3B and the prior art level converter circuit 100 with respect to the voltage value of the low power supply voltage VDDL. The delay time of the level converter circuit 1 of FIG. 3B is compared with the delay time of the prior art level converter circuit 100 shown in FIG. 2. The prior art level converter circuit 100 operates at higher speed than the level converter circuit 1 when the low power supply voltage VDDL is not lower than 0.7 V. However, the operating delay of the level converter circuit 100 exponentially increases as the low power supply voltage VDDL is lowered, and the level converter circuit 100 cannot operate when the low power supply voltage VDDL becomes 0.52 V or less. This is because the current for discharging the terminal T102 to lower the voltage of the output signal OUT depends on the voltage of the low power supply voltage VDDL in the prior art level converter circuit 100. That is, the current flowing through the nMOS transistor MN102 decreases and the delay time exponentially increases as the low power supply voltage VDDL becomes a lower voltage. When the low power supply voltage VDDL becomes 0.52 V or less, the amount of the current flowing through the pMOS transistor MP102 becomes larger than the amount of the current flowing through the nMOS transistor MN102, and the logic value of the output signal OUT is not inverted, stopping the operation of the level converter circuit 100.

On the other hand, in the level converter circuit 1, the delay time is determined by the amount of current of the current $I_{A1}$ generated by the current generator circuit 10. In a region in which the low power supply voltage VDDL is lower than about 0.65 V, the nMOS transistors MN11 and MN12 of the current generator circuit 10 operate in the subthreshold region. Therefore, as shown in FIG. 14, the amount of current of the current $I_{A1}$ changes exponentially to the low power supply voltage VDDL. As a result, the delay time exponentially decreases in accordance with a rise in the low power supply voltage VDDL. Moreover, in a region in which the low power supply voltage VDDL is higher than about 0.65 V, the delay time becomes almost constant. This is because the current $I_{A1}$ generated by the current generator circuit 10 increases when the low power supply voltage VDDL becomes higher than about 0.65 V, whereas the capability of supplying the current $I_{A1}$ generated by the low-pass filter effect of the current mirror circuit is reduced as shown in FIG. 15. As a result, neither the current $I_{A2}$ flowing through the differential amplifier circuit 30 nor the current $I_{A3}$ flowing through the source-grounded amplifier circuit 40 increases, and the delay time becomes almost constant. This coincides with the result of FIG. 15 also for the reason that the frequency reciprocal of the delay time of FIG. 17 is on several megahertz order. Since the level converter circuit 1 carries out both charging and discharging of the terminal T2 by using a current corresponding to the current $I_{A1}$ generated by the current generator circuit 10, such a problem that the prior art level converter circuit 100 has does not occur, and stable operation is achieved with a low power supply voltage VDDL such that a power supply voltage difference between the low power supply voltage VDDL and the high power supply voltage VDDH becomes large.

Figure 18:
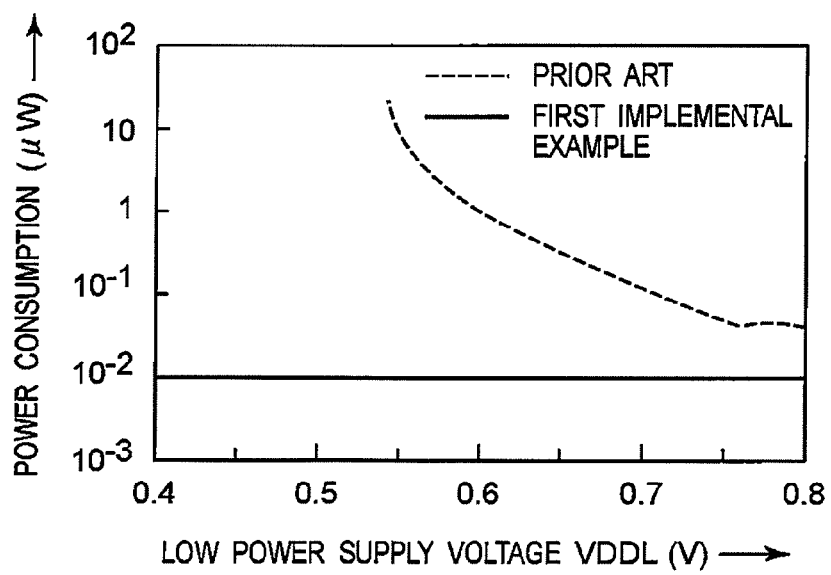
FIG. 18 is a graph showing power consumptions of the level converter circuit 1 of FIG. 3B and the prior art level converter circuit 100 with respect to the voltage value of the low power supply voltage VDDL.

FIG. 18 is a graph showing a power consumption of the level converter circuit 1 of FIG. 3B and the power consumption of the prior art level converter circuit 100 with respect to the voltage value of the low power supply voltage VDDL. In this case, the frequency of the input signal IN is 1 kHz. Moreover, the power consumption of the level converter circuit 1 of FIG. 313 is compared with the power consumption of the prior art level converter circuit 100 shown in FIG. 2. As is apparent from FIG. 18, the level converter circuit 1 is operable with low power consumption as compared with the prior art level converter circuit 100. The prior art level converter circuit 100 has high power consumption because a large amount of through current flows from the high voltage source.

Moreover, in FIG. 18, it can be confirmed that the power consumption of the prior art level converter circuit 100 is exponentially reduced in accordance with a rise in the low power supply voltage VDDL. This is ascribed to the signal waveform of the logic circuit that operates on the low power supply voltage VDDL. In the logic circuit that operates on the low power supply voltage VDDL, the current driving capability of the transistors becomes extremely reduced, and the signal gradually changes. Therefore, the signal transition duration becomes long in the case of a low power supply voltage VDDL of about 0.55 V, and a large amount of through current flows from the high voltage source. On the other hand, the signal steeply changes in accordance with a rise in the low power supply voltage VDDL, and therefore, the through current from the high voltage source decreases.

On the other hand, the power consumption of the level converter circuit 1 scarcely changes even if the low power supply voltage VDDL changes. This is caused by the following two grounds due to a rise in the low power supply voltage VDDL:

(1) an increase in the current $I_{A1}$ generated by the current generator circuit 10; and (2) an improvement in the signal delay of the logic circuit driven by the low power supply voltage VDDL.

As shown in FIG. 14, the current $I_{A1}$ generated by the current generator circuit 10 exponentially increases in accordance with a rise in the low power supply voltage VDDL. On the other hand, the delay time of the logic circuit that operates on the low power supply voltage VDDL exponential decreases in accordance with a rise in the low power supply voltage VDDL. Due to these two grounds, the current $I_{A1}$ that momentarily flows exponentially increases, whereas the time duration when the current $I_{A1}$ flows becomes exponentially shorter. Therefore, the total amount of the current $I_{A1}$ that finally flows scarcely changes. Therefore, the power consumption of the level converter circuit 1 has small dependence on the low power supply voltage VDDL.

Table 1 shows tolerances to the process variations of the level converter circuit 1 of FIG. 3B and the prior art level converter circuit 100 and temperature changes. In Table 1, the low power supply voltage VDDL is 0.6 V. Moreover, FF, FS, TT, SF and SS in Table 1 represent the corner model of an nMOS transistor and a pMOS transistor, P represents a pass state in which the level converter circuit normally operates, and F represents a fail state in which the level converter circuit does not normally operate.

TABLE 1

| Type | Temperature (° C.) | Process Corner | | | | |
|---|---|---|---|---|---|---|
| | | FF | FS | TT | SF | SS |
| Level Converter of First Implemental Example | −20 | P | P | P | P | P |
| | 40 | P | P | P | P | P |
| | 100 | P | P | P | P | P |
| Level Converter of Prior Art | −20 | P | P | P | F | F |
| | 40 | P | P | P | P | F |
| | 100 | P | P | P | P | P |

The prior art level converter circuit 100 does not normally operate when the threshold voltage of the nMOS transistor is raised by the process variations and temperature changes. This is ascribed to the fact that the terminal T102 is not discharged because the current flowing through the nMOS transistor MN102 becomes smaller than the leakage current flowing through the pMOS transistor MP102 in a manner similar to that of the results of the dependence of the delay time on the low power supply voltage VDDL. On the other hand, the level converter circuit 1 operates stably to the process variations and temperature changes.

Figure 19:
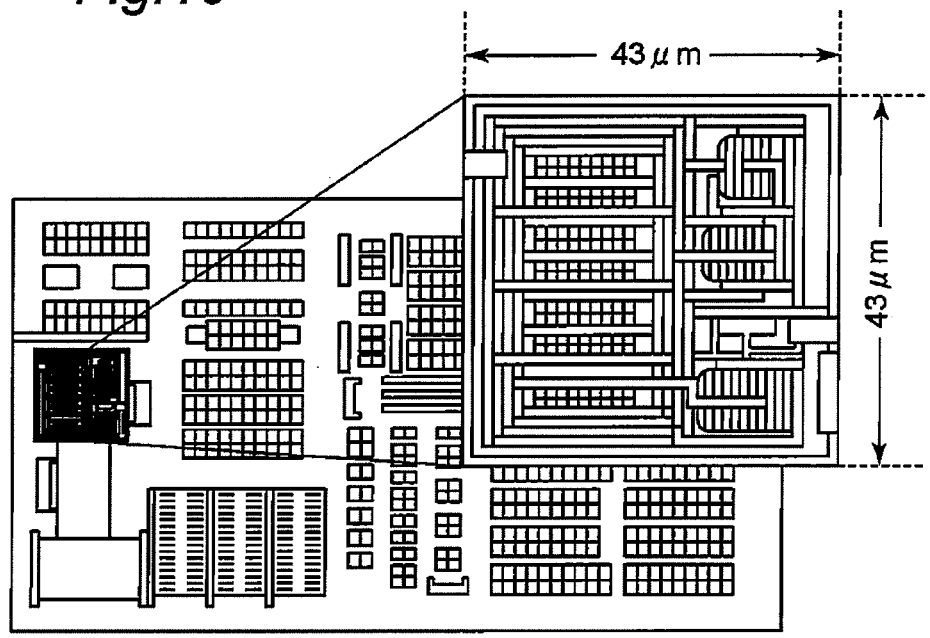
FIG. 19 is a photograph of a prototype chip for the level converter circuit 1 of FIG. 3B.

The present inventors produced a chip for trial purposes to confirm the effectiveness of the level converter circuit 1. The measurement results of the signal waveforms and the power consumption of the prototype chip are shown below. In this case, a 0.35-μm 2P-4M CMOS process was used. FIG. 19 shows a photograph of the prototype chip. The circuit area is a small area of 43 μm×43 μm.

Figure 20:
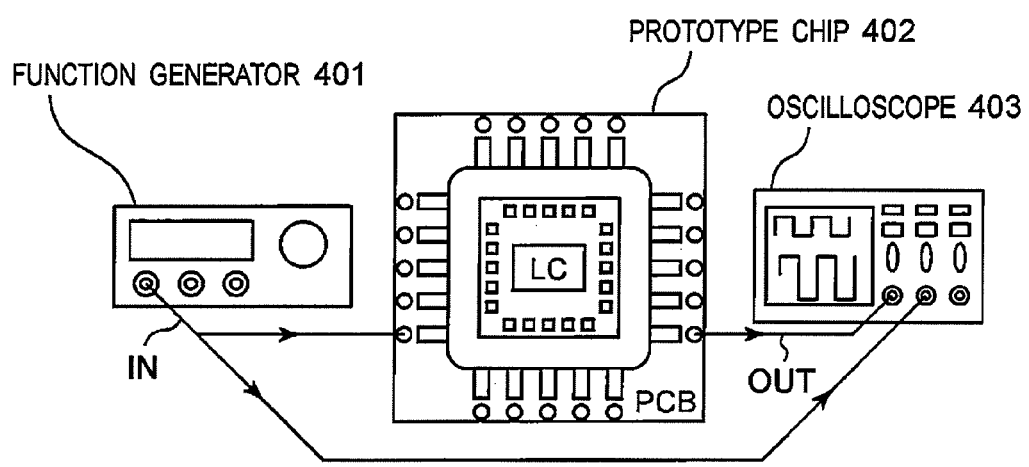
FIG. 20 is a block diagram showing a measurement environment for measuring the operation of the prototype chip of FIG. 19.

FIG. 20 is a block diagram showing a measurement environment for measuring the operation of the prototype chip of FIG. 19. As shown in FIG. 20, measurements were performed by mounting a packaged prototype chip 402 on a board. The input signal IN of low amplitude is generated by using a function generator 401, and the signal is inputted to the level converter circuit (prototype chip 402). The input signal IN from the function generator 401 and the output signal OUT from the level converter circuit were inputted to an oscilloscope 403 and evaluated. Moreover, the high power supply voltage VDDH is 3 V.

FIG. 21(a) is a graph showing a waveform of the input signal IN to the prototype chip 402 in the measurement environment of FIG. 20, and FIG. 21(b) is a graph showing a waveform of the output signal OUT from the prototype chip in the measurement environment of FIG. 20. Namely, FIG. 21(a) and FIG. 21(b) show the waveform of the input signal IN and the waveform of the output signal OUT when the low power supply voltage VDDL is 0.4 V and the frequency of the input signal IN is 10 kHz. It can be confirmed that the low-amplitude input signal IN having an amplitude of 0.4 V is converted in level into a large-amplitude output signal OUT having an amplitude of 3 V by the level converter circuit 1.

Figure 21:
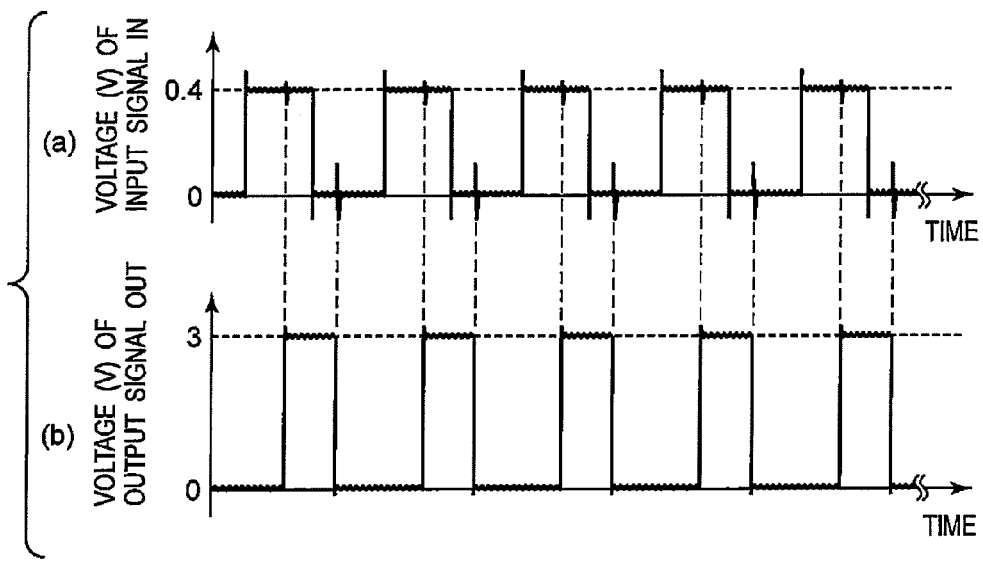
FIG. 21 is a graph showing a waveform of the input signal IN to a prototype chip 402 in the measurement environment of FIG. 20, and showing a waveform of the output signal OUT from the prototype chip in the measurement environment of FIG. 20.

Moreover, as apparent from the results of FIG. 21, it can be understood that the rise time and the fall time from the change in the input signal IN until the change of the output signal OUT differ from each other. As a result, the duty ratio of the output signal OUT became 50% or less. This is attributed to the characteristics of the level converter circuit 1. The charging and discharging of the terminal T2 of the level converter circuit 1 shown in FIG. 3B is performed by the current flowing through the pMOS transistor MP41 and the nMOS transistor MN41. In this case, the rise time of the output signal OUT is determined by the current flowing through the pMOS transistor MP41, i.e., a current corresponding to the current $I_{A1}$ generated by the current generator circuit 10 supplied via the current mirror circuit. On the other hand, the current flowing through the nMOS transistor MN41 is determined by the voltage applied to the gate of the nMOS transistor MN41. A time duration when the capacitance of the gate of the nMOS transistor MN41 is charged and discharged is also determined by a current corresponding to the current $I_{A1}$ generated by the current generator circuit 10 supplied via the current mirror circuit. However, due to the characteristics of the circuit configuration of the differential amplifier circuit 30, a time duration when the terminal T2 is charged by the pMOS transistor MP41 and a time duration when the terminal T2 is discharged by the nMOS transistor MN41 differ from each other. Therefore, the rise time and the fall time of the output signal OUT produce different results. It is required to put the duty ratio close to 50% by constituting a circuit such that the rise time becomes equal to the fall time or taking similar measures.

Figure 22:
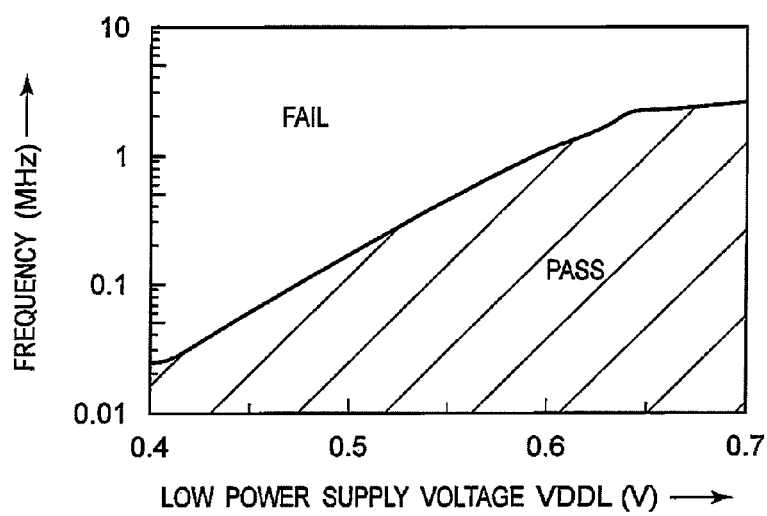
FIG. 22 is a graph showing a Shmoo plot of the prototype chip of FIG. 19.

FIG. 22 is a graph showing a Shmoo plot of the prototype chip of FIG. 19. A frequency band in which the level converter circuit 1 is operable is plotted with respect to the low power supply voltage VDDL. When the low power supply voltage VDDL is about 0.4 to 0.64 V, the operable maximum frequency exponentially increases. This is because the current $I_{A1}$ generated by the current generator circuit 10 exponentially increases in accordance with a rise in the low power supply voltage VDDL. When the low power supply voltage VDDL exceeds 0.64 V, the operable frequency becomes almost constant from about 2 MHz. This is because the high frequency components of the current $I_{A1}$ generated by the current generator circuit 10 are not supplied to the differential amplifier circuit 30 and the source-grounded amplifier circuit 40 by the low-pass filter effect of the current mirror circuit, and the current flowing through the differential amplifier circuit 30 and the source-grounded amplifier circuit 40 are limited in a manner similar to that of the simulation results shown in FIG. 17.

Figure 23:
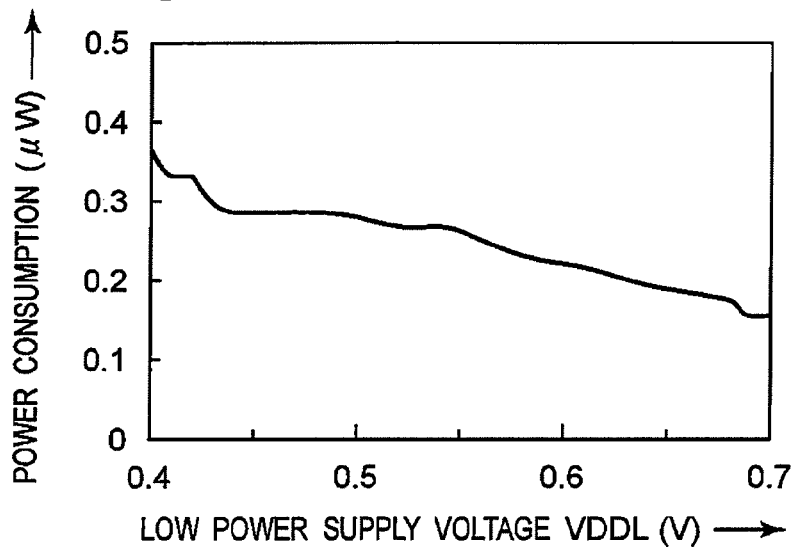
FIG. 23 is a graph showing a power consumption of the prototype chip of FIG. 19 with respect to the voltage value of the low power supply voltage VDDL.

FIG. 23 is a graph showing a power consumption of the prototype chip of FIG. 19 with respect to the voltage value of the low power supply voltage VDDL. In this case, the frequency of the input signal IN is 10 kHz. The power consumption of the prototype chip has small dependence on the low power supply voltage VDDL and decreases with a rise in the low power supply voltage VDDL. This agrees with the simulation results of FIG. 18.

The level converter circuit 1, which operates with lower power consumption than the cross-coupled level converter circuit 100 and stably operates even if the low power supply voltage VDDL is a low voltage, is useful for low voltage operation LSIs.

In the first preferred embodiment, the level converter circuit 1 that can stably operate even when the difference voltage between the power supply voltages of the circuit blocks is large is proposed. The level converter circuit 1 eases the power supply voltage difference dependence of the charging and discharging part, which is the problem of the prior art level converter circuit 100, by constituting the circuit based on the two-stage amplifier circuit. Further, the level converter circuit 1, which consumes power only when the input signal IN changes, can operate with low power consumption. A chip was produced for trial purposes by using the 0.35-μm standard CMOS process, and the operation was confirmed by measurements. By using the level converter circuit 1, the low voltage signal of amplitude of 0.4 V can be converted into the high voltage signal of amplitude of 3 V. The level converter circuit 1 is useful for low-power-consumption low-voltage-operation LSIs.

Second Implemental Example

A simulation evaluation (second implemental example) of a level converter circuit 1A according to the second preferred embodiment will be described. The present inventors conducted a simulation evaluation to confirm the operation of the level converter circuit 1A. In this case, the 0.35-μm CMOS process was used.

Figure 24:
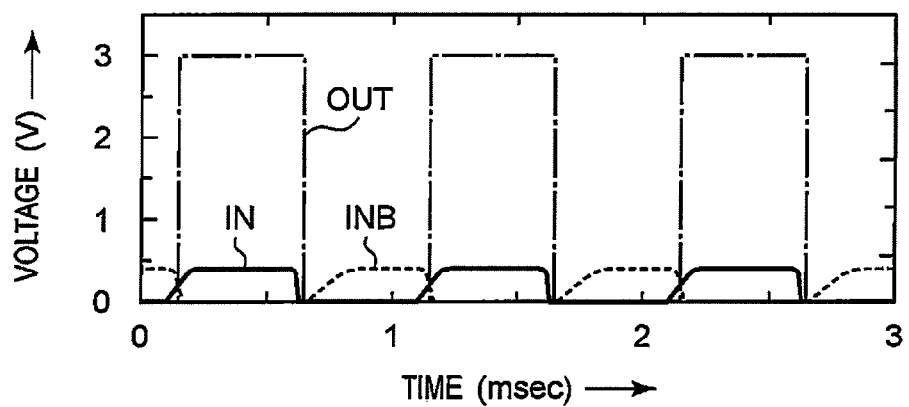
FIG. 24 is a graph showing a waveform of the input signals IN and INB to the level converter circuit 1A of FIG. 11B and the waveform of the output signal OUT from the level converter circuit 1A of FIG. 11B.
Figure 25:
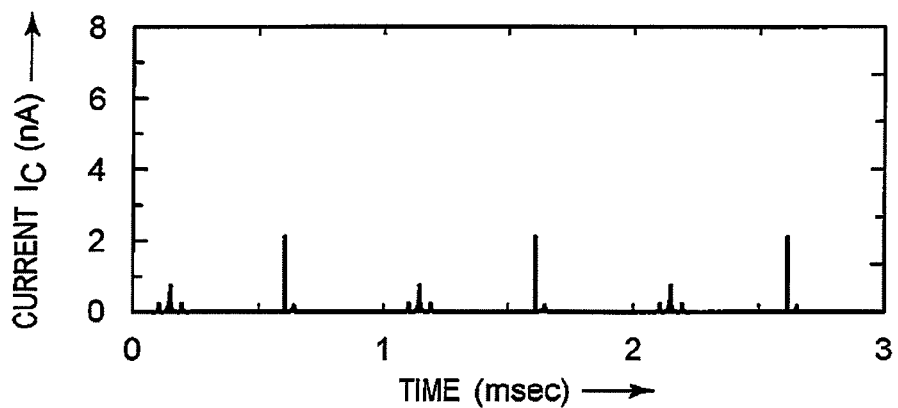
FIG. 25 is a graph showing a waveform of a current $I_C$ generated by the change current generator circuit 11 of FIG. 12.
Figure 26:
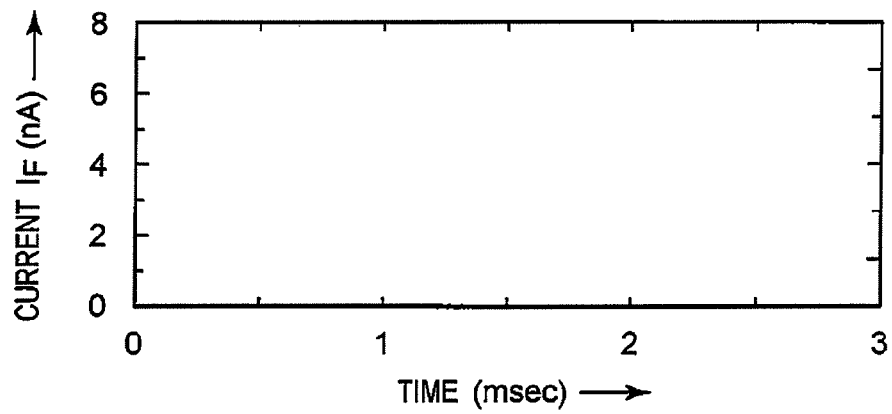
FIG. 26 is a graph showing a waveform of a current $I_F$ generated by the fall current generator circuit 13 of FIG. 12.
Figure 27:
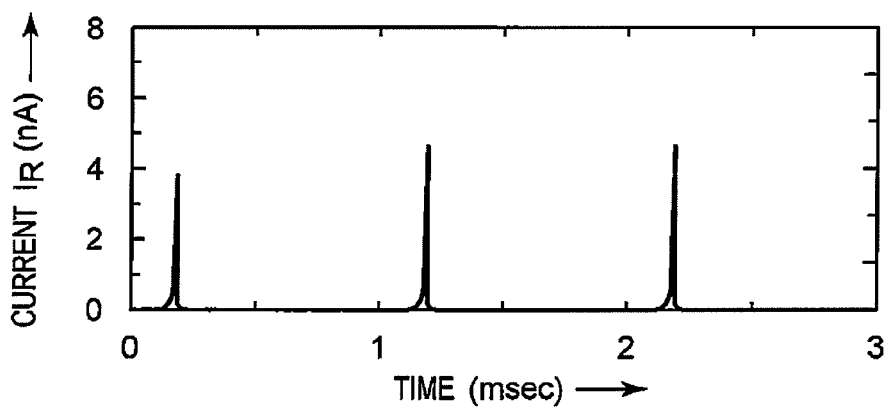
FIG. 27 is a graph showing a waveform of a current $I_R$ generated by the rise current generator circuit 12 of FIG. 12.

The present inventors conducted a simulation evaluation of the level converter circuit 1A. In this case, the low power supply voltage VDDL is 0.4 V, and the high power supply voltage VDDH is 3.0 V. The simulation results are shown in FIGS. 24 to 27. FIG. 24 is a graph showing waveforms of the input signals IN and INB to the level converter circuit 1A of FIG. 11B and the waveform of the output signal OUT from the level converter circuit 1A of FIG. 11B. FIG. 25 is a graph showing a waveform of the current $I_C$ generated by the change current generator circuit 11 of FIG. 12. FIG. 26 is a graph showing a waveform of the current $I_F$ generated by the fall current generator circuit 13 of FIG. 12. FIG. 27 is a graph showing a waveform of the current $I_R$ generated by the rise current generator circuit 12 of FIG. 12.

As shown in FIG. 24, the output signal OUT is converted in level and outputted in conformity to the logic value of the input signal IN. Moreover, the waveforms overlap each other at the rise of the input signal IN and the fall of the input signal INB, whereas the waveforms do not overlap each other at the fall of the input signal IN and the rise of the input signal INB. This means that the current $I_C$ is not correctly generated at the fall of the input signal IN.

As shown in FIG. 25, the change current generator circuit 11 normally generates the current $I_C$ (a peak current on the one nano-ampere order) at the rise time of the input signal IN. On the other hand, the change current generator circuit 11 seems to generate the current $I_C$ (a peak current on the two nano-ampere order) at the fall time of the input signal IN. However, since the input signal IN and the input signal INB do not overlap each other at the fall of the input signal IN as described above, it cannot be said that the change current generator circuit 11 does not normally operate. The current $I_C$ is generated by the kickback phenomenon of the output signal OUT, and is not generated by the change current generator circuit 11.

However, the level converter circuit 1A performs the desired operation (i.e., outputting the low-level output signal OUT). This is because the level conversion operation of the level converter circuit 1A depends on the delay time of the rise time and the delay time of the fall time of the output signal OUT in the differential amplifier circuit 30 and the source-grounded amplifier circuit 40 and the delay time of the current generator circuit 10A. In the differential amplifier circuit 30 and the source-grounded amplifier circuit 40 of the level converter circuit 1A, the rise delay time of the output signal OUT is determined by the charging current $I_{43}$ of the pMOS transistor MP41, and the fall time of the output signal OUT is determined by the discharging current $I_{44}$ of the nMOS transistor MN41. It can be considered that the charging current $I_{43}$ depends on the current $I_{41}$ generated by the current generator circuit 10A, and the discharging current $I_{44}$ does not depend on the current generated by the current generator circuit 10A.

This is considered in the circuit diagram of the differential amplifier circuit 30 and the source-grounded amplifier circuit 40 shown in FIG. 11B. The charging current $I_{43}$ corresponds to the current $I_{41}$ generated by the current generator circuit 10A supplied via the current mirror circuit as configured to include the pMOS transistors MP21 and MP41. On the other hand, the discharge current $I_{44}$ depends on the gate voltage of the nMOS transistor MN41 of the source-grounded amplifier circuit 40, i.e., a voltage at the node N31 of the differential amplifier circuit 30. The voltage at the node N31 changes into a voltage close to the first high level from the low level when the input signal IN becomes the low level. Since the voltage at the node N31 is applied to the gate of the nMOS transistor MN41, the output signal OUT falls to the low level. The voltage at the node N31 does not depend on the current $I_{41}$ generated by the current generator circuit 10A and becomes a voltage close to the first high level to make the output signal OUT fall. That is, in the differential amplifier circuit 30 and the source-grounded amplifier circuit 40, the rise delay time of the output signal OUT is long, and the fall delay time is short. Since the rise delay time is long, a logical inconsistency occurs at the rise of the input signal IN. The rise current generator circuit 12 of the current generator circuit 10A detects the logical inconsistency, and generates the current $I_R$ to accelerate the rise of the output signal OUT. On the other hand, since the differential amplifier circuit 30 and the source-grounded amplifier circuit 40 of the level converter circuit 1A respond quickly at the fall of the output signal OUT, the level converter circuit 1A can output the low-level output signal OUT even if the fall current generator circuit 13 does not operate.

As shown in FIG. 26, it can be confirmed that the current $I_F$ is not generated. This is because the output signal OUT falls to the low level before the current generator circuit 10A starts operating since the fall delay time of the output signal OUT is short. On the other hand, although the current $I_C$ is generated at the rise of the output signal OUT as shown in FIG. 25, it cannot be regarded to be a sufficient amount of current to raise the output signal OUT. The rise current generator circuit 12 detects the logical inconsistency and generates the current $I_R$. As shown in FIG. 27, it can be confirmed that the current $I_R$ is generated at the rise of the output signal OUT.

Figure 28:
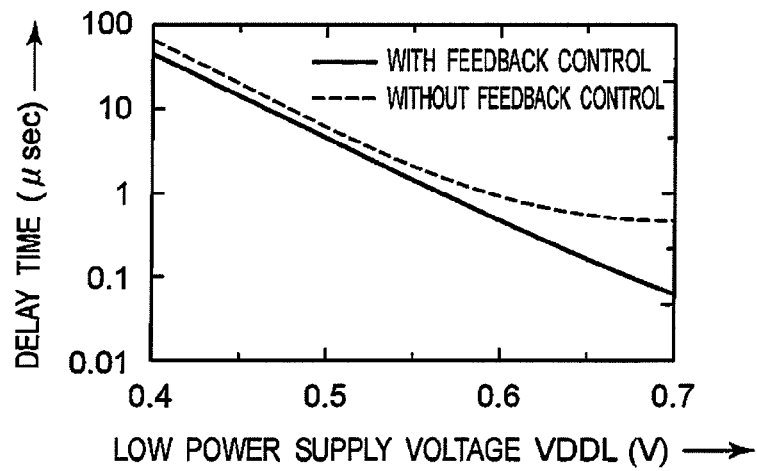
FIG. 28 is a graph showing delay times of the level converter circuit 1A of FIG. 11B and the level converter circuit 1 of FIG. 3B with respect to the voltage value of the low power supply voltage VDDL.

FIG. 28 is a graph showing delay times of the level converter circuit 1A of FIG. 11B and the level converter circuit 1 of FIG. 3B with respect to the voltage value of the low power supply voltage VDDL. In FIG. 28, the delay time of the level converter circuit 1A having the feedback control is indicated by the solid line, and the delay time of the level converter circuit 1 having no feedback control is indicated by the dashed line. As shown in FIG. 28, it can be confirmed that the delay time of the level converter circuit 1A decreases with a rise in the low power supply voltage VDDL. Moreover, it can be confirmed that the level converter circuit 1A operates at higher speed than the level converter circuit 1. It can be confirmed that the level converter circuit 1A operates at a speed several times higher than the level converter circuit 1 when the low power supply voltage VDDL is a low voltage of not higher than about 0.55 V, and the difference increases as the low power supply voltage VDDL rises. It can be said that the addition of the current $I_R$ generated by the rise current generator circuit 12 and the current $I_F$ generated by the fall current generator circuit 13 to the operating currents of the differential amplifier circuit 30 and the source-grounded amplifier circuit 40 leads to the high-speed operation of the level converter circuit 1A.

Figure 29:
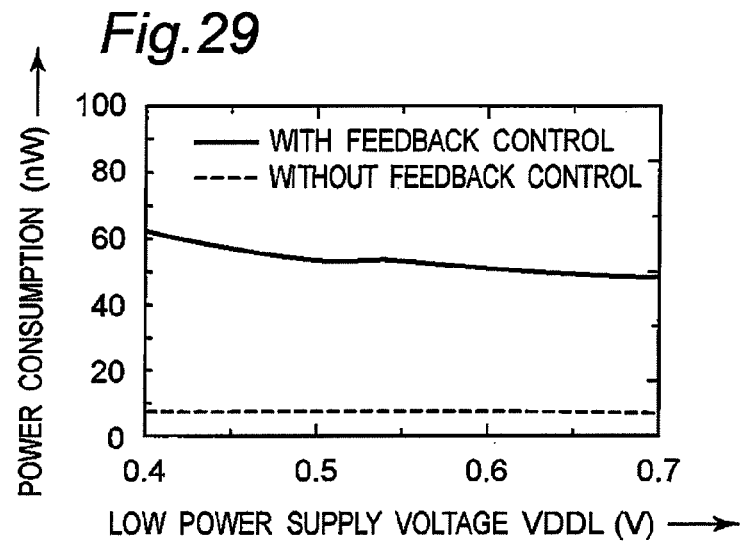
FIG. 29 is a graph showing power consumptions of the level converter circuit 1A of FIG. 11B and the level converter circuits 1 of FIG. 3B with respect to the voltage value of the low power supply voltage VDDL.

FIG. 29 is a graph showing power consumptions of the level converter circuit 1A of FIG. 11B and the level converter circuit 1 of FIG. 3B with respect to the voltage value of the low power supply voltage VDDL. Referring to FIG. 29, the power consumption of the level converter circuit 1A having feedback control is indicated by the solid line, and the power consumption of the level converter circuit 1 having no feedback control is indicated by the dashed line. The level converter circuit 1A has more power consumption than the level converter circuit 1. This is because the current $I_R$ generated by the rise current generator circuit 12 and the current $I_F$ generated by the fall current generator circuit 13 are added to the operating currents of the differential amplifier circuit 30 and the source-grounded amplifier circuit 40. However, the increased power consumption can be suppressed to a minute power on the nano-watt order.

The present inventors conducted a simulation evaluation for performing the characteristic evaluation of the current generator circuit 10A. In this case, the following two simulations were conducted in the current generator circuit 10A shown in FIG. 12.

Simulation 1: The current $I_R$ generated by the rise current generator circuit 12 and the current $I_F$ generated by the fall current generator circuit 13 are measured by fixing the input signal IN to the first high level, fixing the input signal INB to the low level and changing the output signal OUT from 0 V to 3 V.

Simulation 2: The current $I_R$ generated by the rise current generator circuit 12 and the current $I_F$ generated by the fall current generator circuit 13 are Measured by fixing the input signal IN to the low level, fixing the input signal INB to the first high level and changing the output signal OUT from 0 V to 3 V.

Figure 30A:
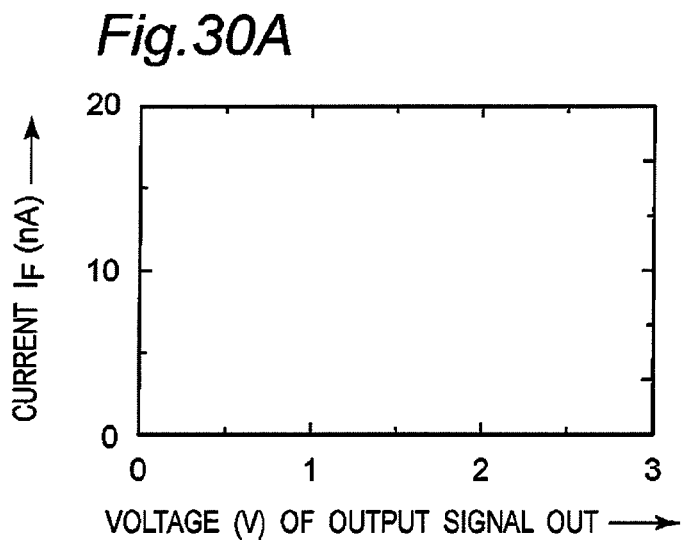
FIG. 30A is a graph showing a current $I_F$ generated when the input signal IN is fixed to the first high level, the input signal INB is fixed to a low level, and the output signal OUT is changed from 0 V to 3 V in the current generator circuit 10A of FIG. 12.
Figure 30B:
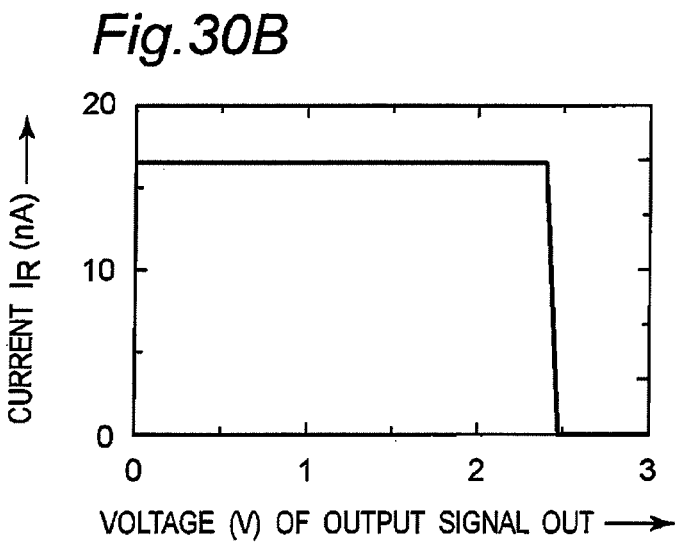
FIG. 30B is a graph showing a current $I_R$ generated when the input signal IN is fixed to the first high level, the input signal INB is fixed to the low level, and the output signal OUT is changed from 0 V to 3 V in the current generator circuit 10A of FIG. 12.

First of all, the results of the Simulation 1 will be described. FIG. 30A is a graph showing a current $I_F$ generated when the input signal IN is fixed to the first high level, the input signal INB is fixed to the low level, and the output signal OUT is changed from 0 V to 3 V in the current generator circuit 10A of FIG. 12. Moreover, FIG. 30B is a graph showing a current $I_R$ generated when the input signal IN is fixed to the first high level, the input signal INB is fixed to the low level, and the output signal OUT is changed from 0 V to 3 V in the current generator circuit 10A of FIG. 12.

Since the input signal IN has the first high level and the input signal INB has the low level, it is ideal that the output signal OUT has the second high level. As shown in FIG. 30B, it can be confirmed that the current $I_R$ is generated when the output signal OUT is a low voltage of not higher than about 2.4 V. The current $I_R$ is supplied to the differential amplifier circuit 30 and the source-grounded amplifier circuit 40 via the current mirror circuit so that the output signal OUT is raised. On the other hand, it can be confirmed that the current $I_R$ is not generated when the output signal OUT is a high voltage, i.e., close to the second high level. Moreover, since the input signal INB has the low level and the output signal OUT is not required to fall in this case, the current $I_F$ is not generated as shown in FIG. 30A. The amount of current of the current $I_R$ (about 17 nA in the Simulation 1) depends on the value (0.4 V in the Simulation 1) of the low power supply voltage VDDL. The current $I_R$ increases when the low power supply voltage VDDL rises.

Figure 31A:
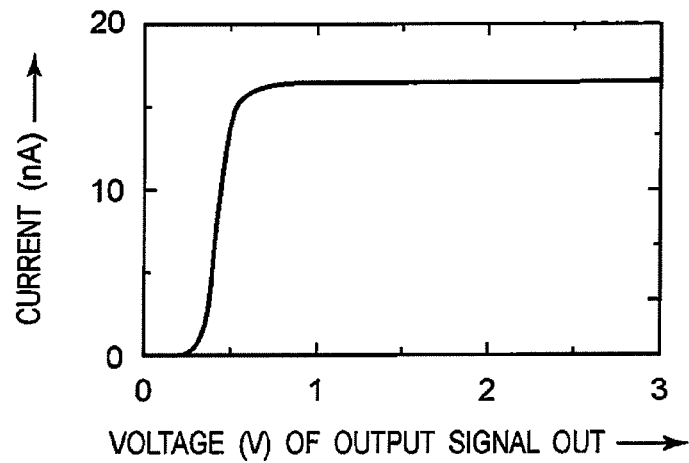
FIG. 31A is a graph showing a current $I_F$ generated when the input signal IN is fixed to the low level, the input signal INB is fixed to the first high level, and the output signal OUT is changed from 0 V to 3 V in the current generator circuit 10A of FIG. 12.
Figure 31B:
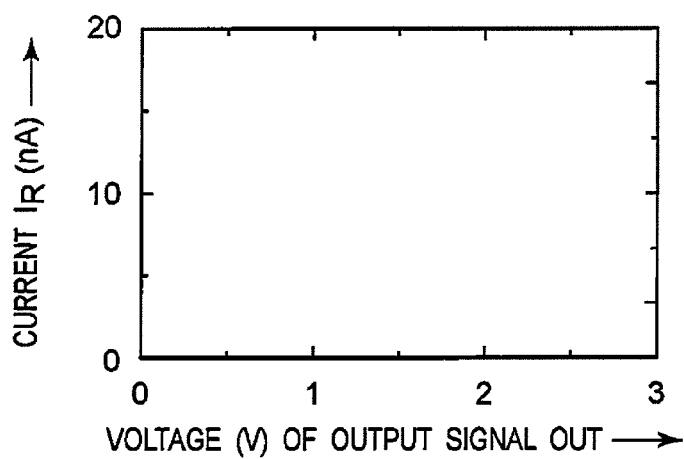
FIG. 31B is a graph showing a current $I_R$ generated when the input signal IN is fixed to the low level, the input signal INB is fixed to the first high level, and the output signal OUT is changed from 0 V to 3 V in the current generator circuit 10A of FIG. 12.

Next, the results of the Simulation 2 will be described. FIG. 31A is a graph showing a current $I_F$ generated when the input signal IN is fixed to the low level, the input signal INB is fixed to the first high level and the output signal OUT is changed from 0 V to 3 V in the current generator circuit 10A of FIG. 12. Moreover, FIG. 31B is a graph showing a current $I_R$ generated when the input signal IN is fixed to the low level, the input signal INB is fixed to the first high level and the output signal OUT is changed from 0 V to 3 V in the current generator circuit 10A of FIG. 12.

Since the input signal IN has the low level and the input signal INB has the first high level, it is ideal that the output signal OUT has the low level. As shown in FIG. 31A, it can be confirmed that the current $I_F$ is generated when the output signal OUT is a high voltage of not lower than about 0.3 V. The current $I_F$ is supplied to the differential amplifier circuit 30 and the source-grounded amplifier circuit 40 via the current mirror circuit so that the output signal OUT is lowered. On the other hand, it can be confirmed that the current $I_F$ is not generated when the output signal OUT is a low voltage, i.e., close to the low level. Moreover, since the input signal IN has the low level and the output signal OUT is not required to rise in this case, the current $I_R$ is not generated as shown in FIG. 31B. The amount of current of the current $I_F$ (about 17 nA in the Simulation 2) depends on the value (0.4 V in the Simulation 2) of the low power supply voltage VDDL. The current $I_F$ increases when the low power supply voltage VDDL rises.

Third Implemental Example

Figure 32:
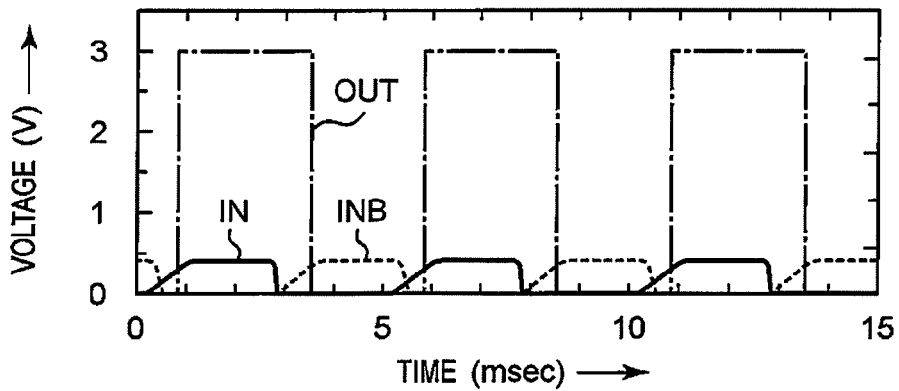
FIG. 32 is a graph showing a waveforms of the input signals IN and INB to the level converter circuit 1B of FIG. 13B and the waveform of the output signal OUT from the level converter circuit 1B of FIG. 13B.
Figure 33:
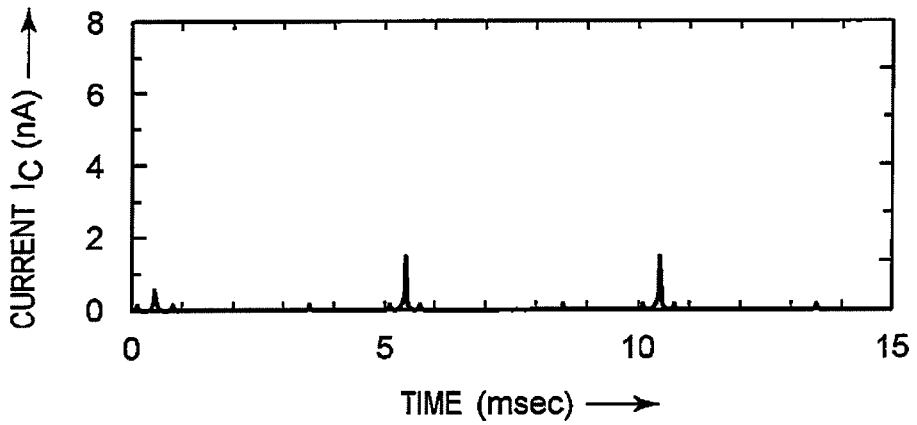
FIG. 33 is a graph showing a waveform of the current $I_C$ generated by the change current generator circuit 11 of FIG. 12.
Figure 34:
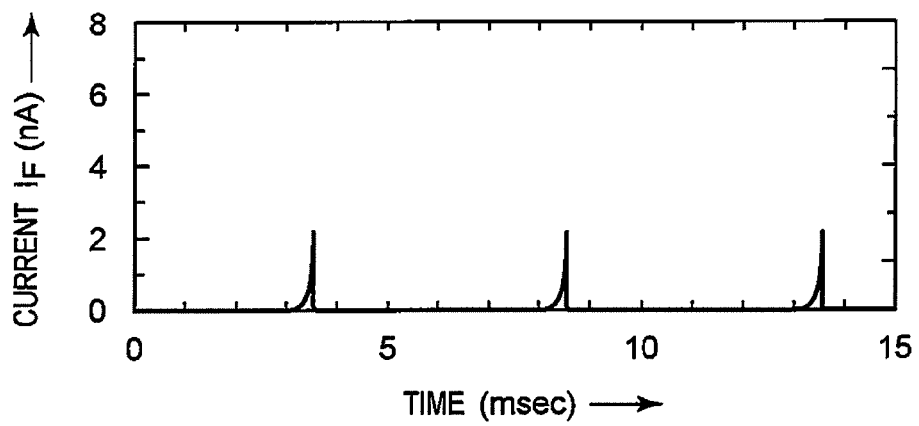
FIG. 34 is a graph showing a waveform of the current $I_F$ generated by the fall current generator circuit 13 of FIG. 12.
Figure 35:
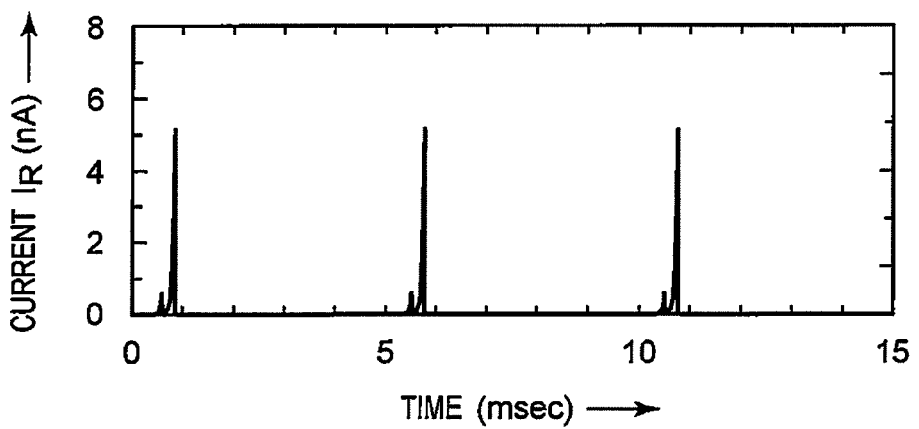
FIG. 35 is a graph showing a waveform of the current $I_R$ generated by the rise current generator circuit 12 of FIG. 12.

A simulation evaluation (third implemental example) of a level converter circuit 1B according to the third preferred embodiment will be described below. The present inventors conducted the simulation evaluation of the level converter circuit 1B. The results are shown in FIGS. 32 to 35. FIG. 32 is a graph showing waveforms of the input signals IN and INB to the level converter circuit 1B of FIG. 13B and the waveform of the output signal OUT from the level converter circuit 1B of FIG. 13B. FIG. 33 is a graph showing a waveform of the current $I_C$ generated by the change current generator circuit 11 of FIG. 12. FIG. 34 is a graph showing a waveform of the current $I_F$ generated by the fall current generator circuit 13 of FIG. 12. FIG. 35 is a graph showing a waveform of the current $I_R$ generated by the rise current generator circuit 12 of FIG. 12.

As shown in FIG. 32, the output signal OUT is converted in level and outputted in conformity to the logic value of the input signal IN. Moreover, the waveforms overlap each other at the rise of the input signal IN and the fall of the input signal INB, whereas the waveforms do not overlap each other at the fall of the input signal IN and the rise of the input signal INB. Therefore, as shown in FIG. 33, the current $I_C$ is generated at the rise of the input signal IN, whereas the current $I_C$ is not generated at the fall of the input signal IN. Since the configuration of the two-stage amplifier circuit is changed in the level converter circuit 1B as compared with the level converter circuit 1A, the output signal OUT does not fall to the low level before the current generator circuit 10A starts operating, and the current $I_F$ is generated in conformity to the analysis as shown in FIG. 34. Moreover, as shown in FIG. 35, the current $I_R$ is generated at the rise of the input signal IN. As described above, it was confirmed that all the circuit blocks (the change current generator circuit 11, the rise current generator circuit 12 and the fall current generator circuit 13) of the current generator circuit 10A operated in conformity to the analysis.

INDUSTRIAL UTILIZATION APPLICABILITY

As mentioned in detail in the above, according to the level converter circuit of the present invention, the signal level is converted by applying the current corresponding to the current generated by the current generator circuit to the amplifier circuit. Therefore, even when the difference between the first signal level and the second signal level is large, the level converter circuit stably operates. Moreover, the current generator circuit generates the control current only when the signal level of the input signal changes and does not generate the control current when the signal level of the input signal does not change, and therefore, the level converter circuit operates with low power consumption.

In addition, according to the level converter circuit of the present invention, the control circuit that changes the substrate potential of the first and second nMOS transistors are further provided so that the control current is increased as compared with the conventional level converter circuit by lowering the threshold voltages of the first and second nMOS transistors as compared with the conventional level converter circuit. Therefore, the level converter circuit operates at higher speed than the conventional level converter circuit.

Further, according to the level converter circuit of the present invention, the other nMOS transistors are connected in parallel with the first and second nMOS transistors, respectively, so that the control current is increased as compared with conventional the level converter circuit. Therefore, the level converter circuit operates at higher speed than the conventional level converter circuit.

Still further, according to the level converter circuit of the present invention, the rise current generator circuit or the fall current generator circuit generate the control current even when there is no period or time interval during which both the input signal and the inverted signal of the input signal have the high level, and therefore, the level converter circuit normally operates. Further, the rise current generator circuit or the fall current generator circuit generates the control current even when the signal level of the output signal changes due to disturbances such as external noises, and therefore, the level converter circuit normally operates.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A level converter circuit for converting an input signal that is a digital signal having a first signal level into an output signal having a second signal level higher than the first signal level, the level converter circuit comprising:
   an amplifier circuit that amplifies the input signal and outputs an amplified output signal;
   a current generator circuit that generates a control current corresponding to an operating current flowing through the amplifier circuit when the signal level of the input signal changes; and
   a current detector circuit that detects the control current generated by the current generator circuit, and controls the operating current of the amplifier circuit to correspond to the detected control current,
   wherein the current generator circuit comprises first and second n-channel MOS transistors that are inserted between the current detector circuit and the ground, and connected in series, and
   wherein the first n-channel MOS transistor operates in response to the input signal, and the second n-channel MOS transistor operates in response to an inverted signal of the input signal.

2. The level converter circuit as claimed in claim 1, further comprising a control circuit that changes a substrate potential of the first and second n-channel MOS transistors so as to increase the control current to be larger than that of a conventional level converter circuit by lowering threshold voltages of the first and second n-channel MOS transistors to be smaller than that of the conventional level converter circuit.

3. The level converter circuit as claimed in claim 1, further comprising a further n-channel MOS transistor that is connected in parallel to each of the first and second n-channel MOS transistors so that the control current is increased so as to be larger than that of a conventional level converter circuit.

4. The level converter circuit as claimed in claim 1,
   wherein the current generator circuit further comprises at least one of:
   a rise current generator circuit that generates the control current for correction so that the output signal becomes a high level when the signal level of the input signal does not change, the input signal has the high level, and the output signal has a low level; and
   a fall current generator circuit that generates the control current for correction so that the output signal becomes the low level when the signal level of the input signal does not change, the input signal has the low level, and the output signal has the high level.

5. The level converter circuit as claimed in claim 4,
   wherein the rise current generator circuit further comprises:
   a p-channel MOS transistor and a third n-channel MOS transistor that are inserted between a voltage source and the ground and connected in series via a predetermined node; and
   fourth and fifth n-channel MOS transistors that are inserted between the current detector circuit and the ground and connected in series, and
   wherein the p-channel MOS transistor operates in response to the output signal, the third n-channel MOS transistor operates in response to the input signal, the fourth n-channel MOS transistor operates in response to the input signal, and the fifth n-channel MOS transistor operates in response to a signal level at the node.

6. The level converter circuit as claimed in claim 4,
   wherein the fall current generator circuit comprises sixth and seventh n-channel MOS transistors that are inserted between the current detector circuit and the ground and connected in series, and
   wherein the sixth n-channel MOS transistor operates in response to the inverted signal of the input signal, and the seventh n-channel MOS transistor operates in response to the output signal.

7. The level converter circuit as claimed in claim 1,
   wherein the amplifier circuit comprises a differential amplifier circuit and a source-grounded amplifier circuit.

8. The level converter circuit as claimed in claim 7,
   wherein the source-grounded amplifier circuit is a push-pull type source-grounded amplifier circuit.

* * * * *